United States Patent
Kodama

(10) Patent No.: US 10,575,446 B2
(45) Date of Patent: Feb. 25, 2020

(54) INVERTER DEVICE

(71) Applicant: FUJI ELECTRIC CO., LTD., Kawasaki-shi, Kanagawa (JP)

(72) Inventor: Masako Kodama, Hino (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 14 days.

(21) Appl. No.: 15/880,004

(22) Filed: Jan. 25, 2018

(65) Prior Publication Data
US 2018/0279501 A1 Sep. 27, 2018

(30) Foreign Application Priority Data

Mar. 22, 2017 (JP) .................. 2017-056439
Mar. 22, 2017 (JP) .................. 2017-056441

(51) Int. Cl.
*H05K 7/20* (2006.01)
*H05K 5/02* (2006.01)
*H05K 7/14* (2006.01)

(52) U.S. Cl.
CPC ........... *H05K 7/209* (2013.01); *H05K 5/0217* (2013.01); *H05K 7/1432* (2013.01); *H05K 7/20918* (2013.01)

(58) Field of Classification Search
CPC .... H05K 7/209; H05K 5/0217; H05K 5/0256; H05K 7/1412; H05K 7/1415
See application file for complete search history.

(56) References Cited

U.S. PATENT DOCUMENTS

| | | | |
|---|---|---|---|
| 7,256,991 B2* | 8/2007 | Sullivan | G06F 1/16 361/679.48 |
| 2011/0297414 A1* | 12/2011 | Chen | G06F 1/181 174/50 |
| 2013/0265721 A1* | 10/2013 | Strader | H05K 7/2039 361/705 |

FOREIGN PATENT DOCUMENTS

| JP | 2005-243741 A | 9/2005 |
|---|---|---|
| JP | 2012-033826 A | 2/2012 |

* cited by examiner

*Primary Examiner* — James Wu
*Assistant Examiner* — Hung Q Dang
(74) *Attorney, Agent, or Firm* — Manabu Kanesaka

(57) ABSTRACT

An inverter device includes a housing that houses a heat generator and a cooler, and a partition. In a state where a pair of side walls are disposed substantially perpendicular to a connection wall, an outer edge of the partition is pressed by the pair of side walls.

16 Claims, 10 Drawing Sheets

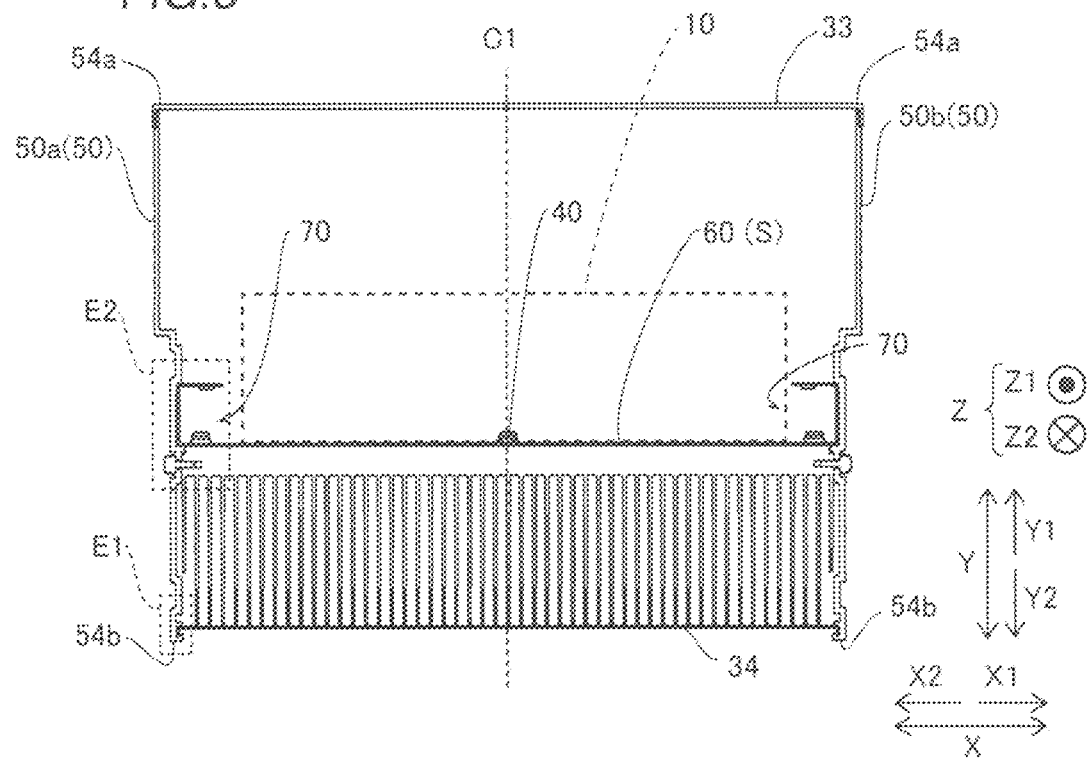
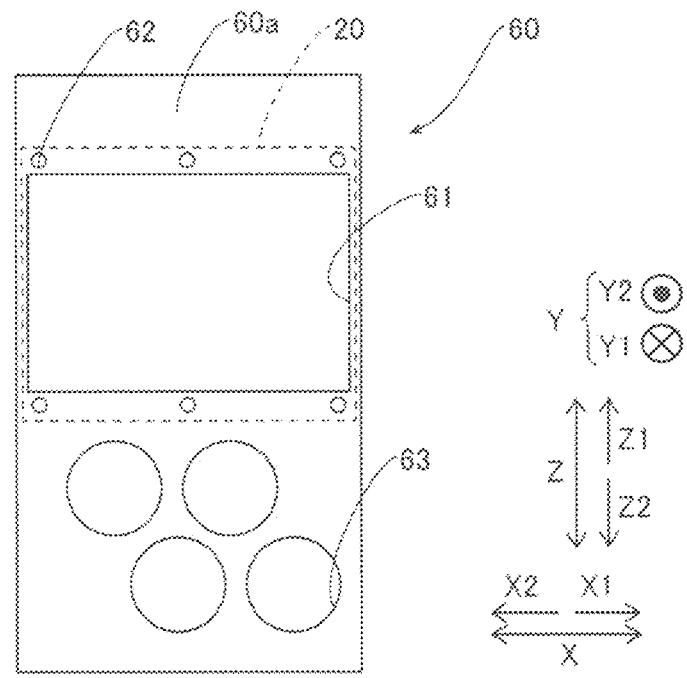

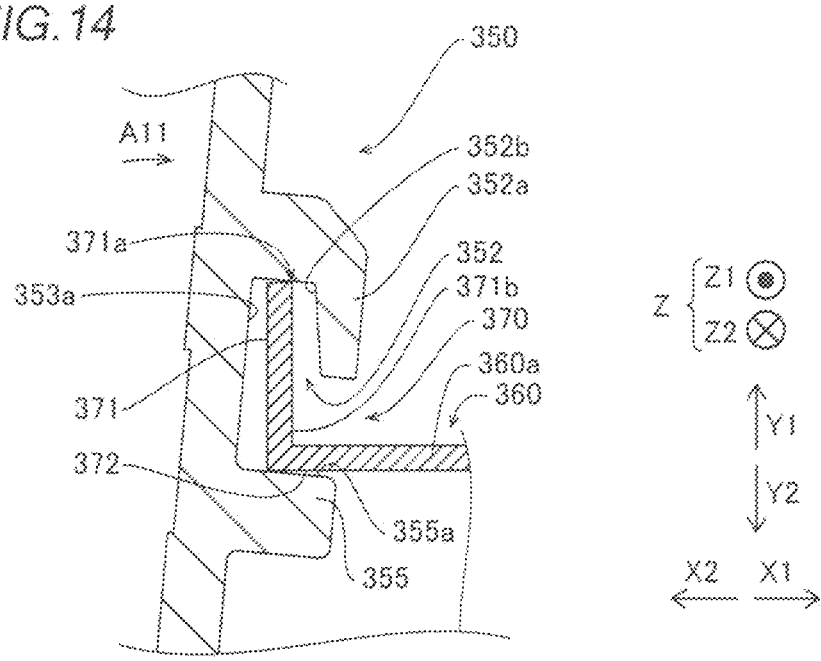
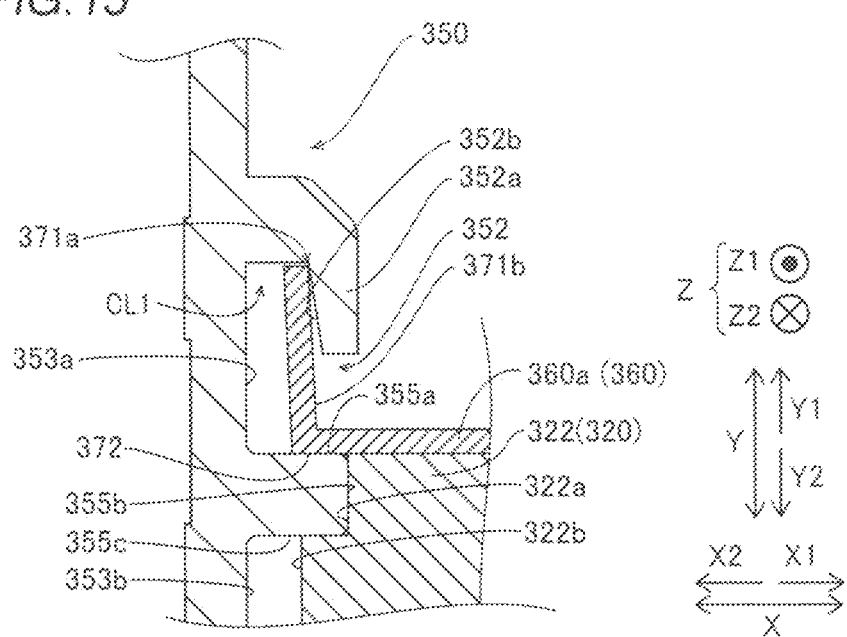

INVERTER DEVICE

CROSS-REFERENCE TO RELATED APPLICATIONS

The priority application numbers JP2017-056439, Inverter Device, Mar. 22, 2017, Masako Kodama, and JP2017-056441, Inverter Device, Mar. 22, 2017, Masako Kodama, upon which this patent application is based, are hereby incorporated by reference.

BACKGROUND OF THE INVENTION

Field of the Invention

The present invention relates to an inverter device.

Description of the Background Art

An inverter device including a partition is known in general, as disclosed in Japanese Patent Laying-Open No. 2005-243741.

In an inverter device described in Japanese Patent Laying-Open No. 2005-243741, a plurality of screws are used to fix an inner metal plate to a pair of side surface metal plates. Therefore, in order to fix the inner metal plate (partition) to the pair of side surface metal plates (a pair of side walls), the number of components in the inverter device disadvantageously increases, and the number of assembling steps of the inverter device disadvantageously increases.

SUMMARY OF THE INVENTION

The present invention has been proposed in order to solve the aforementioned problems, and an object of the present invention is to provide an inverter device in which an increase in the number of components due to fixing of the partition and the pair of side walls to each other can be significantly reduced or prevented and for which an increase in the number of assembling steps can be significantly reduced or prevented.

In order to attain the aforementioned object, an inverter device according to as aspect of the present invention includes a heat generator including a power conversion element, a cooler that cools the heat generator, a housing that houses the heat generator and the cooler and includes a pair of side walls that face each other and a connection wall that connects the pair of side walls to each other, and a partition provided separately from the housing and of which the heat generator is disposed on a first side and the cooler is disposed on a second side, and in a state where the pair of side walls are disposed substantially perpendicular to the connection wall, an outer edge of the partition is pressed by the pair of side walls.

In the inverter device according to this aspect of the present invention, as hereinabove described, in a state where the pair of side walls are disposed substantially perpendicular to the connection wall, the outer edge of the partition is pressed by the pair of side walls. Thus, the partition can be fixed to the pair of side walls without using fastening members such as screws. Consequently, it is possible to significantly reduce or prevent an increase in the number of components in the inverter device due to fixing of the partition and the pair of side walls to each other, and it is possible to significantly reduce or prevent an increase in the number of steps for assembling the inverter device as compared with the case where the inverter device is assembled using a plurality of fastening members such as screws.

In the aforementioned inverter device, in the state where the pair of side walls are disposed substantially perpendicular to the connection wall, the outer edge of the partition is preferably pressed by the pair of side walls such that the partition is fixed to inner sides of the pair of side walls. According to this configuration, it is possible to further significantly reduce or prevent an increase in the number of components in the inverter device due to fixing of the partition and the pair of side walls to each other, and it is possible to further significantly reduce or prevent an increase in the number of steps for assembling the inverter device as compared with the case where the inverter device is assembled using a plurality of fastening members such as screws.

In the aforementioned inverter device, inner portions of the pair of side walls each preferably include a first side wall-side engagement portion that engages with the outer edge of the partition. According to this configuration, the inner portions of the pair of side walls and the outer edge of the partition can engage with each other, and hence the partition can be more firmly fixed to the pair of side walls.

In the aforementioned inverter device, inner portions of the pair of side walls each preferably include a second side wall-side engagement portion that engages with an outer edge of the connection wall such that the pair of side walls can be inclined with respect to a direction substantially perpendicular to the connection wall. According to this configuration, the pair of side walls and the connection wall can be engaged with each other by the second side wall-side engagement portion without using fastening members such as screws, and hence the number of components in the inverter device can be reduced, and the number of steps for assembling the inverter device can be reduced. Furthermore, in a state where the pair of side walls and the connection wall engage with each other, the pair of side walls can be inclined with respect to the direction substantially perpendicular to the connection wall, and hence the pair of side walls are inclined with respect to the connection wall in a state where the pair of side walls and the connection wall engage with each other such that the partition can be easily disposed between the pair of inclined side walls.

In the aforementioned inverter device, the outer edge of the partition preferably includes a bent portion that protrudes in a direction substantially perpendicular to a partition body of the partition, and the bent portion preferably engages with the first side wall-side engagement portion. According to this configuration, the outer edge of the partition and the first side wall-side engagement portion can be easily engaged with each other by the bent portion that protrudes in the direction substantially perpendicular to the partition body.

In the aforementioned inverter device, the outer edge of the connection wall preferably includes a connection wall-side protrusion that protrudes in a direction substantially perpendicular to a connection wall body of the connection wall, and the connection wall-side protrusion preferably engages with the second side wall-side engagement portion. According to this configuration, the connection wall and the second side wall-side engagement portion can be easily engaged with each other by the connection wall-side protrusion that protrudes in the direction substantially perpendicular to the connection wall body.

In the aforementioned inverter device, the housing preferably includes a top plate fixed to the pair of side walls in a state where the top plate is disposed substantially perpendicular to each of the pair of side walls and the connection wall. According to this configuration, a state where the pair of side walls are disposed substantially perpendicular to the connection wall can be maintained due to the top plate, and hence the top plate is disposed such that the pair of side walls and the partition can be fixed to each other without separately providing a step for fixing the pair of side walls and the partition to each other. As a result, the number of steps for assembling the inverter device can be reduced.

In the aforementioned inverter device, the first side wall-side engagement portion preferably includes an inclined surface that presses the bent portion in the state where the pair of side walls are disposed substantially perpendicular to the connection wall. According to this configuration, even when a dimensional error of the partition body or the bent portion or flexure deformation of the bent portion occurs, the end of the bent portion in the protruding direction is reliably pressed by the inclined surface such that the partition and the pair of side walls can be fixed to each other.

In the aforementioned inverter device, the pair of side walls each preferably include a side wall-side protrusion that protrudes inwardly, and the outer edge of the partition preferably includes a partition-side contact portion that comes into contact with a first surface of the side wall-side protrusion. According to this configuration, in a state where the outer edge of the partition is pressed by the pair of side walls, the first surface of the side wall-side protrusion and the partition-side contact portion come into contact with each other, and hence the partition and the pair of side walls can be more firmly fixed to each other.

In the aforementioned inverter device, the partition is preferably slidable along inner side surfaces of the pair of side walls in a state where the pair of side walls are inclined with respect to a direction substantially perpendicular to the connection wall. According to this configuration, when the inverter device is assembled, the partition is slid along the inner side surfaces of the pair of side walls such that the partition can be easily disposed inside the pair of side walls.

In the aforementioned inverter device, the pair of side walls are preferably molded by extrusion in a direction along the outer edge of the partition. According to this configuration, a plurality of types of side walls having different dimensions in the direction along the outer edge of the partition can be molded with the same extrusion die, and hence it is possible to significantly reduce or prevent complexity of a manufacturing apparatus for the inverter device.

In the aforementioned inverter device, in a state where a contact portion of the partition provided along the outer edge of the partition and that contacts the pair of side walls is pressed by the pair of side walls, a contact structure is preferably formed between inner portions of the pair of side walls and the outer edge of the partition. According to this configuration, the contact structure can significantly reduce or prevent passing of liquid (water), dust, etc. in portions between the inner portions of the pair of side walls and the outer edge of the partition, and hence it is not necessary to provide sealing members or the like for waterproofing and dustproofing separately from the partition and the pair of side walls. As a result, it is possible to significantly reduce or prevent an increase in the number of components while ensuring the waterproofness and dustproofness.

In the aforementioned inverter device, the contact portion of the partition is preferably pressed by the pair of side walls to form a dustproof and waterproof structure as the contact structure. According to this configuration, the dustproofness and waterproofness can be easily ensured by the dustproof and waterproof structure between the contact portion of the partition and the pair of side walls without providing sealing members. In this description, the term "dustproof and waterproof structure" indicates a wider concept including not only a structure in which neither duct nor liquid passes but also a structure in which at least duct and liquid are less likely to pass.

In the aforementioned inverter device, the contact portion of the partition is preferably provided from a vicinity of a first end of the outer edge of the partition to a vicinity of a second end thereof, and the inner portions of the pair of side walls each preferably include a side wall-side contact portion provided along the outer edge of the partition and that contacts the contact portion of the partition. According to this configuration, the dustproofness and waterproofness can be ensured without providing sealing members over a wide range from the vicinity of the first end of the outer edge of the partition to the vicinity of the second end thereof.

In this case, the outer edge of the partition preferably includes a bent portion that protrudes in a direction substantially perpendicular to a partition body of the partition, and the side wall-side contact portion preferably includes an inclined surface that comes into contact with the bent portion. According to this configuration, even when a dimensional error of the partition body or the bent portion or flexure deformation of the bent portion occurs, the end of the bent portion in the protruding direction can be reliably pressed by the inclined surface, and hence the dustproofness and waterproofness can be more reliably ensured.

In the aforementioned inverter device, the pair of side walls each preferably include a side wall-side protrusion that protrudes inwardly, and the contact portion of the partition preferably includes a first partition-side contact portion that contacts the side wall-side contact portion and a second partition-side contact portion that contacts a first surface of the side wall-side protrusion in a state where the side wall-side contact portion and the first partition-side contact portion contact each other. According to this configuration, both the first partition-side contact portion and the second partition-side contact portion can significantly reduce or prevent passing of liquid (water), dust, etc. in the portions between the inner portions of the pair of side walls and the outer edge of the partition, and hence the dustproofness and waterproofness can be further improved.

In this case, the first surface of the side wall-side protrusion and the second partition-side contact portion preferably come into surface contact with each other. According to this configuration, the dustproofness and waterproofness can be still further improved as compared with the case where the first surface of the side wall-side protrusion and the second partition-side contact portion come into line contact with each other.

In the aforementioned inverter device, a labyrinth structure is preferably formed by the pair of side walls and an outer edge of the cooler on a second surface side of the side wall-side protrusion. According to this configuration, the dustproof and waterproof structure can also be formed between the pair of side walls and the outer edge of the cooler, and hence the dustproofness and waterproofness can be ensured not only between the partition and the pair of side walls but also between the cooler and the pair of side walls.

In the aforementioned inverter device, the outer edge of the partition is preferably not pressed by the pair of side walls in a state where the pair of side walls are inclined with respect to a direction substantially perpendicular to the connection wall, but the outer edge of the partition is preferably pressed by the pair of side walls in the state where the pair of side walls are disposed substantially perpendicular to the connection wall. According to this configuration, the angle of the pair of side walls with respect to the connection wall is changed such that it is possible to easily switch between a state where the outer edge of the partition is pressed by the pair of side walls and a state where the outer edge of the partition is not pressed by the pair of side walls. As a result, when the inverter device is assembled, for example, the partition can be easily disposed at a corresponding position between the pair of side walls by inclining the pair of side walls with respect to the direction substantially perpendicular to the connection wall. Furthermore, the outer edge of the partition is pressed by the pair of side walls by disposing the pair of side walls in the direction substantially perpendicular to the connection wall when the inverter device is assembled, and hence the inverter device can be easily assembled.

In the aforementioned inverter device, the partition is preferably slidable along inner side surfaces of the pair of side walls in a state where the pair of side walls are inclined with respect to a direction substantially perpendicular to the connection wall. According to this configuration, when the inverter device is assembled, the partition is slid along the inner side surfaces of the pair of side walls such that the partition can be easily disposed inside the pair of side walls.

In the aforementioned inverter device, the pair of side walls are preferably molded by extrusion in a direction along the outer edge of the partition. According to this configuration, a plurality of types of side walls having different dimensions in the direction along the outer edge of the partition can be molded with the same extrusion die, and hence it is possible to significantly reduce or prevent complexity of a manufacturing apparatus for the inverter device.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a sectional view showing the configuration of the inverter device according to the first embodiment of the present invention;

FIG. 4 is a diagram of the configuration of a frame member according to the first embodiment of the present invention, as viewed from the arrow Y2 direction side;

FIG. 14 is a sectional view showing a state where a pair of side walls according to the second embodiment of the present invention do not press the outer edge of a frame member;

FIG. 15 is a partial enlarged view showing a region indicated by d reference numeral E11 in FIG. 13;

DESCRIPTION OF THE PREFERRED EMBODIMENTS

Embodiments of the present invention are hereinafter described with reference to the drawings.

[First Embodiment]

The configuration of an inverter device 100 according to a first embodiment is now described with reference to FIGS. 1 to 11.

(Overall Configuration of Inverter Device)

Figure 1:
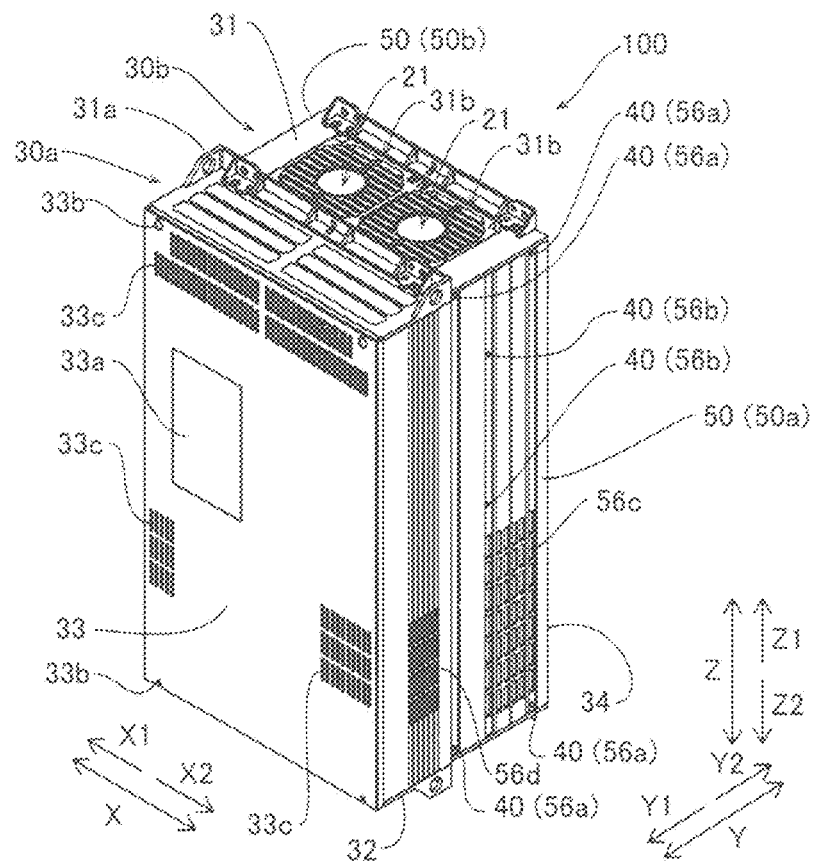
FIG. 1 is a perspective view of an inverter device according to a first embodiment of the present invention.
Figure 2:
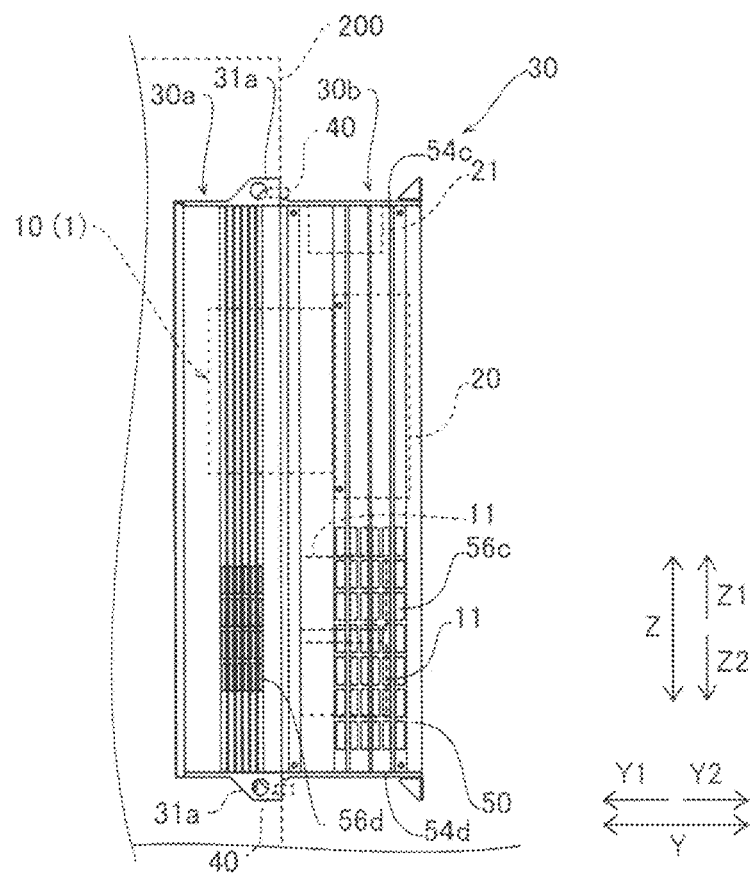
FIG. 2 is a side elevational view of the inverter device according to the first embodiment of the present invention.

The inverter device 100 converts input direct-current or alternating-current power into set alternating-current power and outputs the alternating-current power. As shown in FIGS. 1 and 2, the inverter device 100 includes a power conversion circuit 10 including a power conversion element 1 that generates heat during power conversion, cooling fins 20 that cool the power conversion circuit 10, a housing 30 that houses the conversion circuit 10 and the cooling fins 20, and fans 21 that discharge air inside the housing 30. The power conversion circuit 10 is an example of a "heat generator" in the claims. The cooling fins 20 are examples of a "cooler" in the claims.

As shown in FIG. 2, the housing 30 includes a front housing 30a disposed inside a power board 200 and a rear housing 30b disposed outside the power board 200. In other words, the rear housing 30b is exposed to the outside of the power board 200. Thus, the rear housing 30b contacts outside air. The inverter device 100 guides the outside air (air) inside the rear housing 30b by taking the outside air (air) into the rear housing 30b through air intake holes (not shown) provided on the lower surface (arrow Z2 direction side) of the rear housing 30b and vent holes 56c provided on the side surface thereof and discharging the air through the fans 21. As a result, the power conversion circuit 10 that has generated heat is cooled by contact of the cooling fins 20 housed in the rear housing 30b with the outside air.

The housing 30 is fixed to a wall (shown by a dotted line in FIG. 2) of the power board 200 by fastening members 40 such as screws via fixing members 31a provided on the arrow Z1 direction side and the arrow Z2 direction side of the housing 30, respectively.

In this description, for the sake of convenience of explanation, words indicating directions such as "front", "rear", "upper (top)", "lower (bottom)", "left", and "right" are used, but the arrangement state (installation state) of the inverter device 100 is not restricted. That is, the inverter device 100 may be installed such that the front housing 30a faces upward.

Furthermore, in the following description, the side on which an operator 33a is provided is set as "front" (arrow Y1 direction in the figures). That is, an arrow X1 direction denotes "left", an arrow X2 direction denotes "right", an arrow Z2 direction denotes "lower (bottom)", an arrow Z1 direction denotes "upper (top)", and an arrow Y2 direction denotes "rear".

(Configuration of Housing)

As shown in FIG. 1, the housing 30 includes a pair of side walls 50 that constitute side walls (walls in a right-left direction) of the front housing 30a and the rear housing 30b and extend while facing each other. The housing 30 includes a top plate 31 that constitutes upper walls of the front housing 30a and the rear housing 30b and a bottom plate 32 that constitutes lower walls of the front housing 30a and the rear housing 30b. The housing 30 includes a front wall 33 that connects the vicinities (see FIG. 3) of first ends 54a of the pair of side walls 50 on the arrow Y1 direction side on the arrow Y1 direction side of the front housing 30a and a rear wall 34 that connects the vicinities (see FIG. 3) of second ends 54b of the pair of side walls 50 on the arrow Y2 direction side on the arrow Y2 direction side of the rear housing 30b. That is, the housing 30 has a substantially rectangular parallelepiped shape, and includes the walls provided separately for each surface. The rear wall 34 is an example of a "connection wall" in the claims.

According to the first embodiment, as shown in FIG. 3, the pair of side walls 50 are molded by extrusion in a direction Z. In other words, the cross-sectional shapes of portions of the pair of side walls 50 not subjected to additional processing, which are parallel to an XY plane, at any height position (position in the direction Z) are substantially the same as each other. Furthermore, the pair of side walls 50 contain aluminum or an aluminum alloy, for example, and the pair of side walls 50 are formed as aluminum extruded plates.

In the following, one of the pair of side walls 50 disposed on the arrow X2 direction side is described as a first side wall 50a, and the other of the pair of side walls 50 disposed on the arrow X1 direction side is described as a second side wall 50b. When the first side wall 50a and the second side wall 50b are not particularly distinguished from each other, the same are simply described as the pair of side walls 50. In addition, "inner", "inside" or "inward (inwardly)" denotes the arrow X1 direction side of the first side wall 50a or the arrow X2 direction side of the second side wall 50b.

The top plate 31 and the bottom plate 32 (see FIG. 1) are cast molded, for example. For example, the top plate 31 and the bottom plate 32 are molded by casting (die-casting) aluminum or an aluminum alloy. The top plate 31 includes exhaust holes 31b, and the air discharged by the fans 21 passes through the exhaust holes 31b. The bottom plate 32 includes the air intake holes (not shown), and the outside air is taken in.

The front wall 33 and the rear wall 34 are made of sheet metal (galvanized steel plate), for example. The front wall 33 and the rear wall 34 are molded by bending processing, punching processing, or the like.

According to the first embodiment, as shown in FIG. 3, the inverter device 100 includes a frame member 60 provided separately from the housing 30 and of which the power conversion circuit 10 is disposed on a first side (arrow Y1 direction side) and the cooling fins 20 are disposed on a second side (arrow Y2 direction side). That is, the frame member 60 is disposed between the pair of side walls 50, and defines a boundary surface S (a plane parallel to an XZ plane) between the power conversion circuit 10 and the cooling fins 20. The frame member 60 partitions a region in which the cooling fins 20 are disposed and a region in which the power conversion circuit 10 is disposed inside the housing 30. The frame member 60 is an example of a "partition" in the claims.

The frame member 60 is made of sheet metal (galvanized steel plate), for example. The frame member 60 partitions the region in which the cooling fins 20 are disposed and to which cooling air is guided (passes) and the region in which the power conversion circuit 10 is disposed inside the housing 30 such that heat interference between the regions is significantly reduced or prevented, and passing of dust or the like and liquid (water) between the regions is significantly reduced or prevented.

As shown in FIG. 4, a frame member body 60a of the frame member 60 includes an opening 61 so as to partially expose the cooling fins 20. The frame member body 60a denotes a flat plate-shaped portion of the frame member 60 along the XZ plane. The frame member 60 (frame member body 60a) includes a plurality of (six, for example) fin fixing holes 62 through which the frame member 60 is fastened and fixed to the cooling fins 20 by the fastening members 40 (see FIG. 3). In addition, the frame member 60 (frame member body 60a) includes a plurality of (four, for example) capacitor placement holes 63 in which a plurality of capacitors 11 are disposed. The frame member body 60a is an example of a "partition body" in the claims.

(Structure for Fixing Frame Member and Side Wall)

Figure 5:
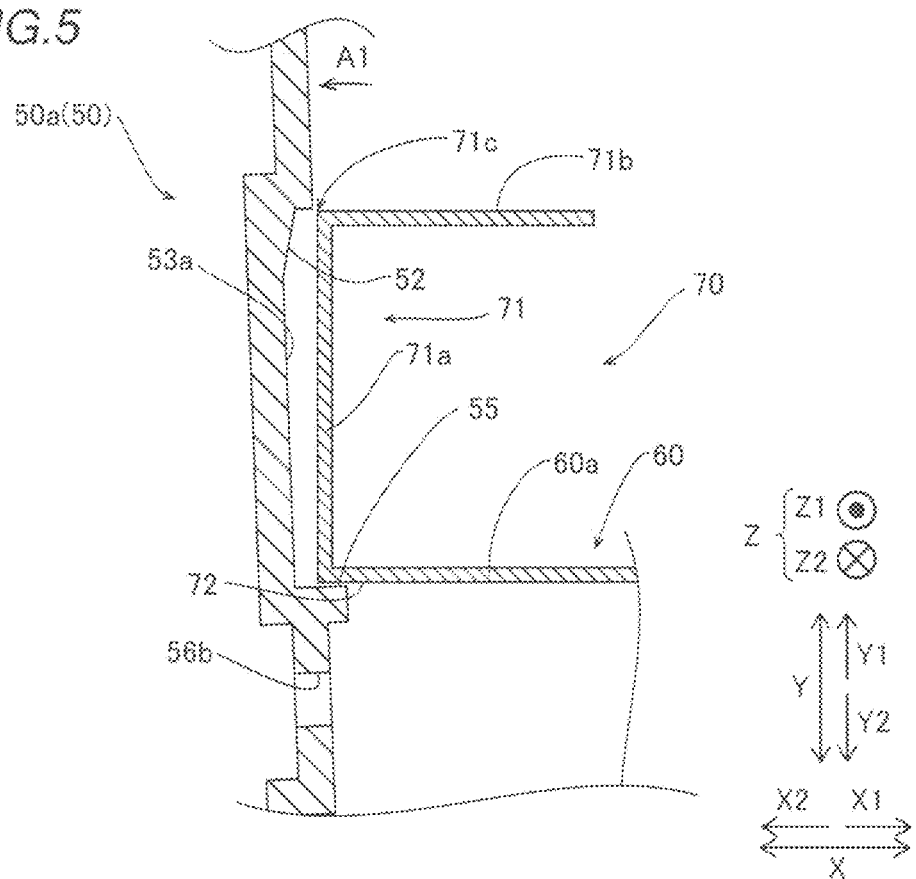
FIG. 5 is a sectional view showing a state where a pair of side walls according to the first embodiment of the present invention do not press the outer edge of the frame member.
Figure 6:
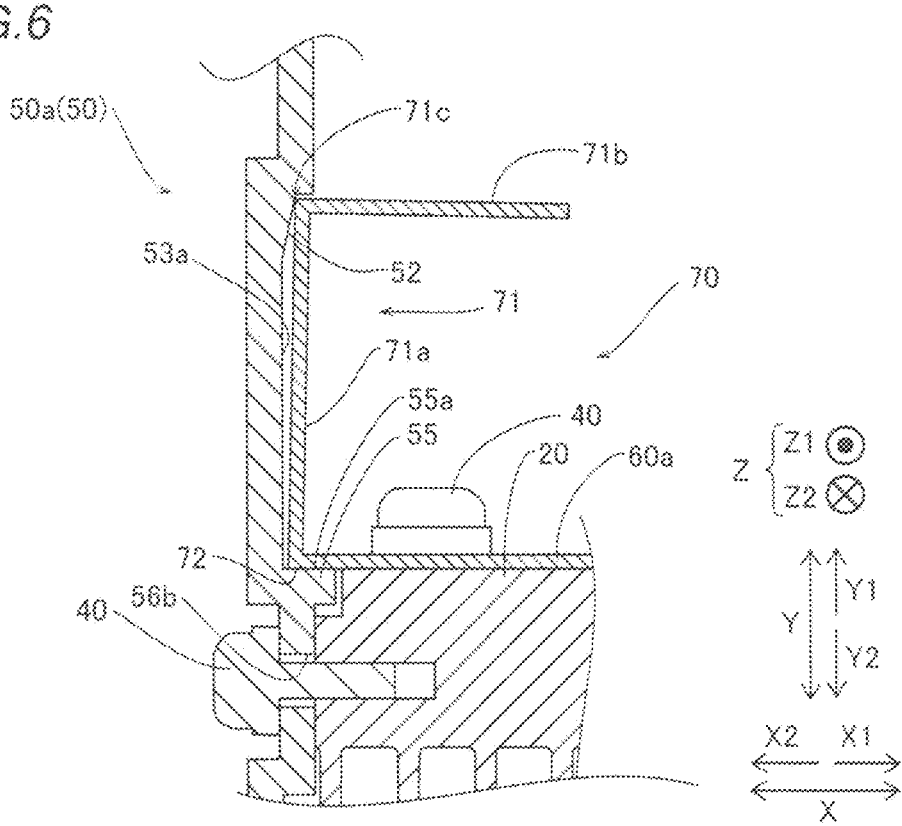
FIG. 6 is a partial enlarged view showing a region indicated by a reference numeral E1 in FIG. 3.

According to the first embodiment, the inverter device 100 includes a strong pressing structure in which the outer edges 70 of the frame member 60 are not pressed by the pair of side walls 50 in a state where the pair of side walls 50 are inclined outwardly (in an arrow A1 direction) with respect to a direction (direction Y) substantially perpendicular to the rear wall 34, as shown in FIG. 5, but the outer edges 70 of the frame member 60 are pressed by the pair of side walls 50 in a state where the pair of side walls 50 are disposed in the direction (direction Y) substantially perpendicular to the rear wall 34, as shown in FIG. 6. A configuration for forming the strong pressing structure is now described.

<Relationship Between Pair of Side Walls and Connection Wall>

Figure 7A:
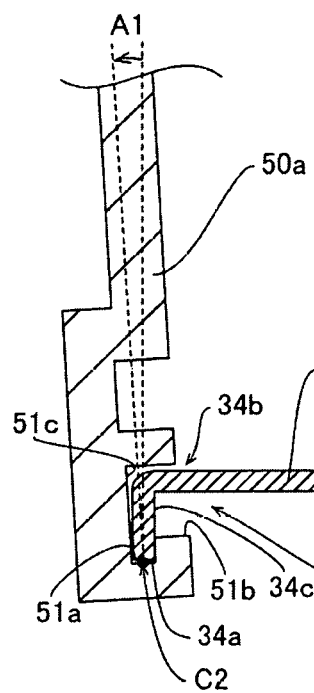
FIGS. 7(a) and 7(b) are partial enlarged views, each showing a region indicated by a reference numeral E2 in FIG. 3.
Figure 7B:
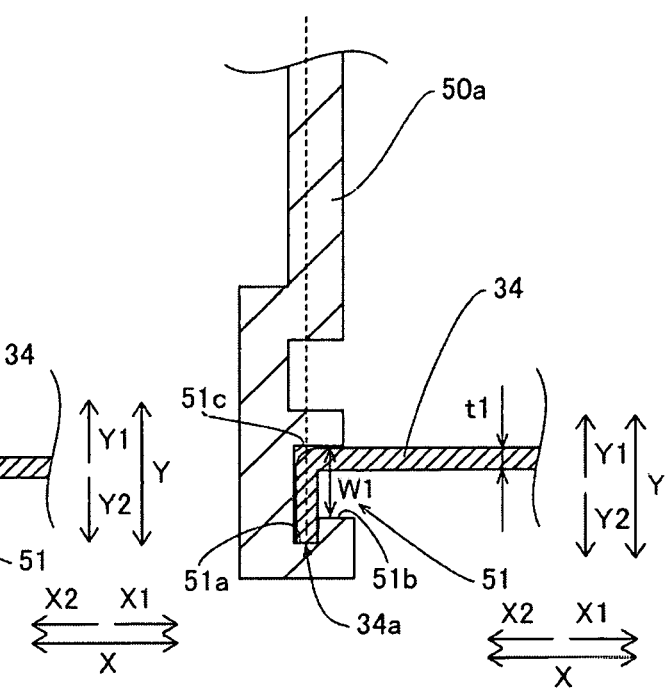

More specifically, as shown in FIGS. 7(a) and 7(b), according to the first embodiment, inner portions of the pair of side walls 50 include engagement grooves 51 that engage with the outer edges 34b of the rear wall 34 such that the pair of side walls can be inclined with respect to the direction substantially perpendicular to the rear wall 34. The engagement grooves 51 are examples of a "second side wall-side engagement portion" in the claims.

A configuration for engagement between the first side wall 50a and both the rear wall 34 and the frame member 60 and a configuration for engagement between the second side wall 50b and both the rear wall 34 and the frame member 60 are substantially line-symmetric with respect to a centerline C1 in FIG. 3, and hence the configuration for engagement between the first side wall 50a and both the rear wall 34 and the frame member 60 is described below, and description of the configuration for engagement between the second side wall 50b and both the rear wall 34 and the frame member 60 is omitted.

As shown in FIGS. 7(a) and 7(b), each of the outer edges 34b of the rear wall 34 has a substantially L-shaped cross-sectional shape. The rear wall 34 includes a rear wall body having a flat plate shape that extends in the XZ plane and a protrusion 34c bent at about 90 degrees in a direction (arrow Y2 direction) perpendicular to the rear wall body on each of the outer edges 34b of the rear wall body, and the distal end 34a thereof is disposed in the arrow Y2 direction. That is, as shown in FIG. 3, the rear wall 34 has a substantially U-shaped cross-sectional shape. The protrusion 34c is an example of a "connection wall-side protrusion" in the claims.

Each of the engagement grooves 51 is recessed in the arrow Y2 direction, the protrusion 34c of each of the outer edges 34b of the rear wall 34 is fitted thereinto, and the engagement groove 51 has a recess 51a that contact the distal end 34a of the outer edge 34b. The engagement groove 51 includes an opening 51b having an opening width W1 larger than the thickness ti of the rear wall 34. Thus, as shown in FIGS. 7(a) and 7(b), in a state where the engagement groove 51 engages with the outer edge 34b of the rear wall 34, the first side wall 50a can be inclined in a direction (arrow A1 direction) open outwardly with respect to the direction (direction Y) substantially perpendicular to the rear wall 34 using an engaging portion between the engagement groove 51 and the distal end 34a of the outer edge 34b as a fulcrum C2, as viewed from the arrow Z1 direction side. Specifically, in a state where the first side wall 50a is inclined in the arrow A1 direction with respect to the rear wall 34, the distal end 34a of the outer edge 34b of the rear wall 34 contacts the bottom of the engagement groove 51, and a portion (the side opposite to the distal end 34a) of the protrusion 34c of the outer edge 34b is separate from the inner surface 51c. Furthermore, the rotation of the pair of side walls 50 inwardly of the direction (direction Y) substantially perpendicular to the rear wall 34 is restricted because the protrusion 34c and the inner surface 51c of the engagement groove 51 come into contact with each other.

<Relationship Between Frame Member and Pair of Side Walls>

According to the first embodiment, as shown in FIG. 5, the frame member 60 includes a frame member body 60a having a flat plate shape that extends in the XZ plane, and the outer edges 70 of the frame member body 60a include protrusions 71 including bent portions 71a that protrude in a direction substantially perpendicular to the frame member body 60a. In the inverter device 100, the protrusions 71 are not pressed by the pair of side walls 50 in a state where the pair of side walls 50 are inclined outwardly (arrow A1 direction) with respect to the direction (direction Y) substantially perpendicular to the rear wall 34, but the protrusions 71 are pressed by the pair of side walls 50 in a state where the pair of side walls 50 are disposed in the direction (direction Y) substantially perpendicular to the rear wall 34. The protrusions 71 are examples of a "contact portion of the partition" or a "first partition-side contact portion" in the claims.

Specifically, the outer edges 70 include the protrusions 71 including the bent portions 71a formed by bending the frame member 60 at about 90 degrees in the direction (arrow Y1 direction) perpendicular to the frame member body 60a and an extension portion 71b formed by bending the distal ends of the bent portions 71a at about 90 degrees in a direction (arrow X1 direction) parallel to the frame member body 60a.

Figure 8:
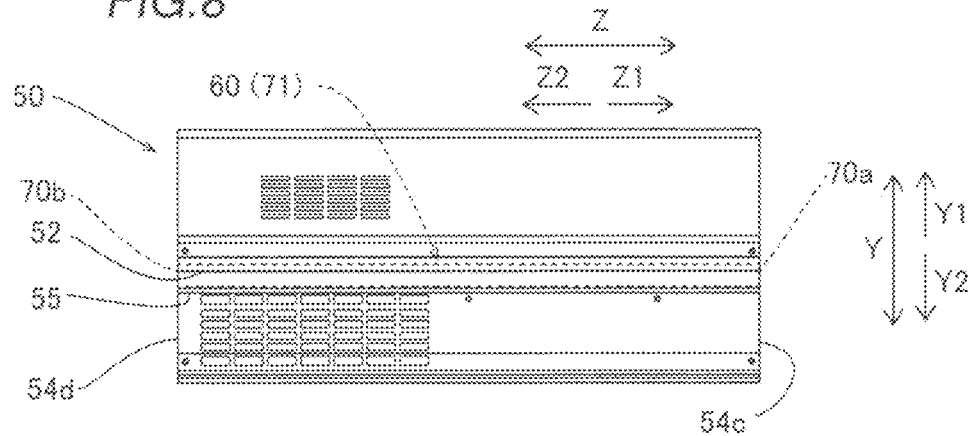
FIG. 8 is a side elevational view of the pair of side walls according to the first embodiment of the present invention, as viewed from the inside.

According to the first embodiment, the pair of side walls 50 include inclined surfaces 52 inclined with respect to the protrusions 71 and that press the vicinities of the ends 71c of the protrusions 71 in the protruding direction (arrow Y1 direction side) of the protrusions 71. Specifically, a recess including an inclined surface 52 and an inner side surface 53a and recessed in the arrow X2 direction from the wall surface of the first side wall 50a is formed, and the inclined surface 52 and the inner side surface 53a are formed from a first end 54c of the side wall 50 in the arrow Z1 direction to a second end 54d thereof in the arrow Z2 direction, as shown in FIG. 8. The inclined surfaces 52 are examples of a "first side wall-side engagement portion", an "inner portion of the side wall", or a "side wall-side contact portion" in the claims.

Figure 9:
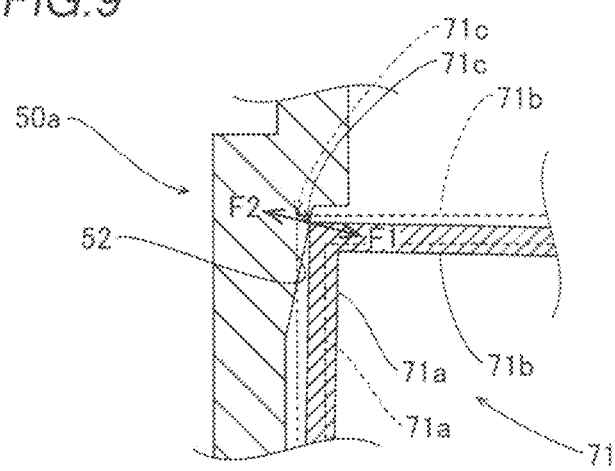
FIG. 9 is a sectional view showing a state where the pair of side walls according to the first embodiment of the present invention press a protrusion of the frame member.

As shown in FIG. 9, the inclined surfaces 52 are located at positions (shown by a dotted line) where the inclined surfaces 52 interfere with the ends 71c of the protrusions 71 in a state where the pair of side walls 50 are disposed in the direction substantially perpendicular to the rear wall 34. Thus, in a state where the pair of side walls 50 are disposed in the direction substantially perpendicular to the rear wall 34, the inclined surfaces 52 interfere with the protrusions 71, and hence the inclined surfaces 52 and the vicinities of the ends 71c including the ends 71c (corners) come into contact with each other, and a pressing force F1 from the inclined surfaces 52 to the protrusions 71 is generated such that the bent portions 71a of the protrusions 71 flex and deform.

The bent portions 71a of the protrusions 71 flex and deform, and hence a repulsive force F2 from the protrusions 71 to the inclined surfaces 52 is generated. That is, the protrusions 71 and the inclined surfaces 52 form the strong pressing structure between the pair of side walls 50 and the frame member 60. Thus, as shown in FIG. 3, the frame member 60 is pressed (strongly pressed) from both sides in a direction X by the pair of side walls 50, and the frame member 60 and the pair of side walls 50 are fixed to each other.

As shown in FIG. 6, according to the first embodiment, the pair of side walls 50 include inward protrusions 55 that face each other and protrude inwardly from the inner side surfaces 53a, respectively. The inward protrusions 55 come into contact with the surfaces 72 of the outer edges 70 of the frame member 60 on the arrow Y2 direction side in a state where the protrusions 71 are pressed by the inclined surfaces 52. The inward protrusions 55 are examples of a "side wall-side protrusion" in the claims. The surfaces 72 are examples of a "partition-side contact portion", a "contact portion of the partition", or a "second partition-side contact portion" in the claims.

Figure 10:
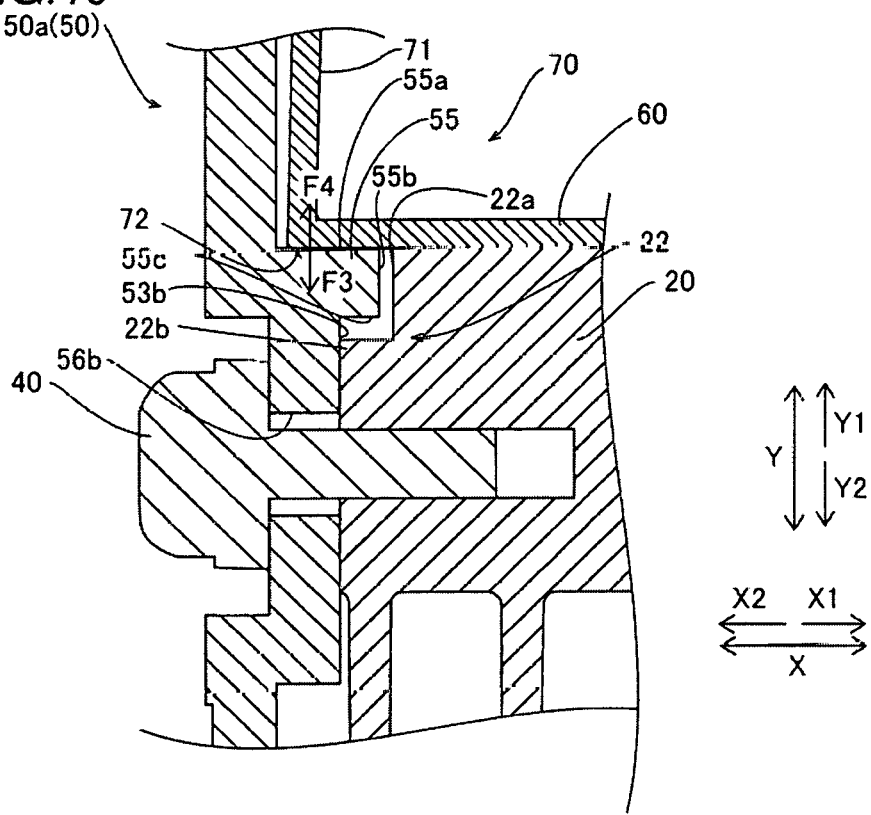
FIG. 10 is a sectional view for illustrating a contact structure between the pair of side walls and the outer edge of the frame member and a labyrinth structure between the pair of side walls and cooling fins according to the first embodiment of the present invention.

Specifically, as shown in FIG. 10, the inward protrusions 55 include side surfaces 55a substantially perpendicular to the inner side surfaces 53a, inner side surfaces 55b substantially parallel to the inner side surfaces 53a continuous with the side surfaces 55a, and side surfaces 55c substantially perpendicular to the inner side surfaces 53a continuous with the side surfaces 55b. Furthermore, as shown in FIG. 8, the inward protrusions 55 are formed from the first ends 54c of the pair of side walls 50 on the arrow Z1 direction side to the second ends 54d thereof on the arrow Z2 direction side. The side surfaces 55a are examples of a "first surface" in the claims. The side surfaces 55c are examples of a "second surface" in the claims.

When the protrusions 71 are pressed by the inclined surfaces 52, the bent portions 71a of the protrusions 11 flex and deform, and hence the surfaces 72 and the side surfaces 55a come into contact with each other, and a pressing force F3 from the surfaces 72 to the side surfaces 55a of the inward protrusions 55 is generated. The shape of the inward protrusions 55 is substantially unchanged, and hence a pressing force F4 from the side surfaces 55a to the surfaces 72 is generated. Thus, the frame member 60 is pressed (strongly pressed) in a state where the frame member 60 is sandwiched from both sides in a forward-rearward direction (direction Y) by the inclined surfaces 52 and the inward protrusions 55. As a result, the positional relationship between the frame member 60 and the pair of side walls 50 in the forward-rearward direction is fixed.

In the inverter device 100 according to the first embodiment, no screws (fastening members) that fix the pair of side walls 50 and the frame member 60 to each other are provided. That is, the inverter device 100 includes a structure without screws between the pair of side walls 50 and the frame member 60. Furthermore, in the inverter device 100, no screws (fastening members) that fix the pair of side walls 50 and the rear wall 34 to each other are provided. That is, the inverter device 100 includes a structure without screws between the pair of side walls 50 and the rear wall 34.

Figure 11A:
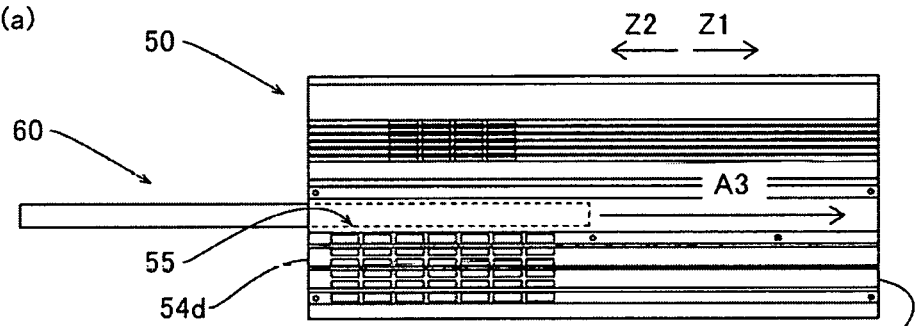
FIGS. 11(a) and 11(b) are diagrams, each illustrating sliding of the frame member with respect to the pair of side walls according to the first embodiment of the present invention.
Figure 11B:
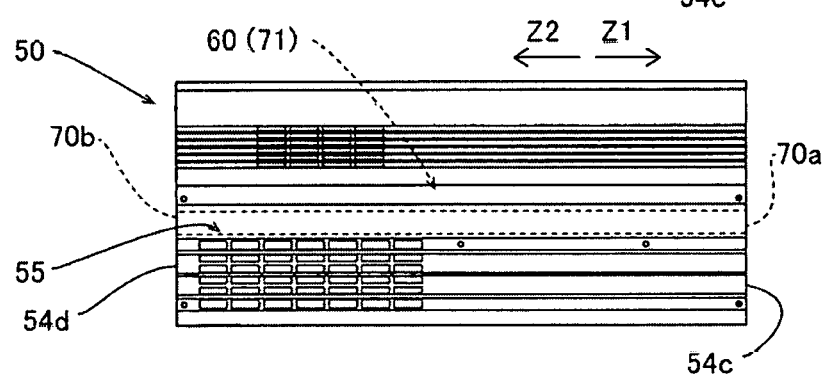

As shown in FIGS. 11(a) and 11(b), according to the first embodiment, in the housing 30, the frame member 60 is slidable along the inner side surfaces 53a (direction Z) of the pair of side walls 50 in a state where the pair of side walls 50 are inclined with respect to the direction substantially perpendicular to the rear wall 34 (in a state where the frame member 60 is not pressed). That is, in a state where the pair of side walls 50 are inclined with respect to the direction substantially perpendicular to the rear wall 34, as shown in FIG. 5, the inclined surfaces 52 do not contact the protrusions 71 such that the protrusions 71 are not pressed by the inclined surfaces 52, and the protrusions 71 and the inclined surfaces 52 can move relative to each other.

The inward protrusions 55 serve as guides when the frame member 60 slides. That is, when the inverter device 100 is assembled, the frame member 60 is slid in the direction Z while the surfaces 72 of the frame member 60 are brought into contact with the side surfaces 55a of the inward protrusions 55 such that the frame member 60 can be moved in the direction Z in a state where the position of the frame member 60 in the direction Y is fixed. A method for assembling (manufacturing) the inverter device 100 is described below in detail.

<Configuration for Fixing Pair of Side Walls and Both Top Plate and Bottom Plate>

As shown in FIG. 1, according to the first embodiment, the housing 30 includes the top plate 31 and the bottom plate 32 both disposed substantially perpendicular to each of the pair of side walls 50 and the rear wall 34. The top plate 31 and the bottom plate 32 are fixed to the pair of side walls 50 in a state where the pair of side walls 50 are disposed substantially perpendicular to the rear wall 34.

Specifically, the top plate 31 is fixed to the pair of side walls 50 by a plurality of fastening members 40 in a state where the pair of side walls 50 are disposed substantially perpendicular to the rear wall 34. The pair of side walls 50 include a plurality of fastening holes 56a that extend from the arrow Y1 direction side to the arrow Y2 direction side. In a state where the fastening members 40 are disposed in the fastening holes 56a, the side walls 50 and the top plate 31 are fastened to each other. Thus, the pair of side walls 50 are fixed in a state where the same are disposed substantially perpendicular to the rear wall 34, and in the fixed state, the pair of side walls 50 press (strongly press) the frame member 60.

The bottom plate 32 constitutes a wall of the housing 30 on the arrow Z2 direction side. Similarly to the top plate 31, the bottom plate 32 is fixed to the pair of side walls 50 by the plurality of fastening members 40 in a state where the pair of side walls 50 are disposed substantially perpendicular to the rear wall 34.

<Remaining Configuration for Fixing Each Portion>

As shown in FIG. 1, the front wall 33 includes the operator 33a, a plurality of fastening holes 33b, and a vent holes 33c. The operator 33a receives operations from a user. The front wall 33 is fastened and fixed to the top plate 31 and the bottom plate 32 by the plurality of fastening members 40 via the fastening holes 33b. Air can pass into the inside of the front housing 30a through the vent holes 33c.

As shown in FIG. 3, the cooling fins 20 are fixed to the frame member 60 by the plurality of fastening members 40 via sealing members (not shown). Furthermore, the cooling fins 20 are fixed to the pair of side walls 50 by the plurality of fastening members 40 disposed in fin fixing holes 56b (see FIG. 1).

As shown in FIG. 2, the fans 21 are fixed to the top plate 31, and the fans 21 are disposed below (arrow Z2 direction side) the top plate 31 and above (arrow Z1 direction side) the cooling fins 20.

The power conversion circuit 10 is disposed in contact with the arrow Y1 direction side of the cooling fins 20. Thus, the heat generated from the power conversion circuit 10 is transferred to the cooling fins 20. The capacitors 11 are fixed into the capacitor placement holes 63 of the frame member 60 by mounting member and fastening members via sealing members (not shown).

(Dustproof and Waterproof Structure between Frame Member and Pair of Side Walls)

A dustproof and waterproof structure between the frame member 60 and the pair of side walls 50 according to the first embodiment is now described with reference to FIGS. 6, 10, and 11.

According to the first embodiment, in a state where the protrusions 71 and the surfaces 72 (outer edges 70) provided along the outer edges 70 of the frame member 60 and that contact the pair of side walls 50 are pressed by the pair of side walls 50, a contact structure is formed over the entire regions of the inclined surfaces 52 and the inward protrusions 55 in the direction Z between both the inclined surfaces 52 and the inward protrusions 55 of the pair of side walls 50 and the outer edges 70 of the frame member 60.

Specifically, as shown in FIG. 8 and FIG. 11(b), the protrusions 71 of the outer edges 70 are provided from the vicinities of the first ends 70a of the outer edges 70 of the frame member 60 on the arrow Z1 direction side to the vicinities of the second ends 70b thereof on the arrow Z2 direction side. As shown in FIG. 6, the pair of side walls 50 include the inclined surfaces 52 provided along the outer edges 70 (direction Z) and that contact the protrusions 71 of the outer edges 70, and the side surfaces 55a that come into surface contact with the surfaces 72 of the outer edges 70. That is, the ends 71c of the protrusions 71 contact the inclined surfaces 52 in a state where the same are pressed (strongly pressed) by the inclined surfaces 52, and the surfaces 72 of the outer edges 70 come into contact (surface contact) with the side surfaces 55a such that a structure in which no liquid flows and no duct passes is formed over entire regions in an upward-downward direction (direction Z) between the outer edges 70 of the frame member 60 and the pair of side walls 50. That is, according to the first embodiment, the dustproof and waterproof structure is formed as the contact structure between the pair of side walls 50 and the outer edges 70 of the frame member 60.

For example, inside the housing 30, from the rear housing 30b, i.e. the cooling fin 20 side (arrow Y2 direction side), to the inside of the front housing 30a, i.e. the power conversion circuit 10 side (arrow Y1 direction side), via between the outer edges 70 of the frame member 60 and the inner side surfaces 53a of the pair of side walls 50, water does not flow and dust does not pass.

As shown in FIG. 10, according to the first embodiment, a labyrinth structure is formed by the pair of side walls 50 and the outer edges 22 of the cooling fins 20 on the side surface 55c sides of the inward protrusions 55. Specifically, the outer edges 22 of the cooling fins 20 include concave portions 22a recessed inwardly such that the inward protrusions 55 are fitted thereinto, and convex portions 22b on the arrow Y2 direction sides of the concave portions 22a. The inward protrusions 55 are fitted into the concave portions 22a, and the inner side surfaces 53b of the pair of side walls 50 and the convex portions 22b are close to each other (contact each other) such that regions (gaps) between the outer edges 22 of the cooling fins 20 and the pair of side walls 50 have a maze (labyrinth) shape. Thus, the dustproof and waterproof structure is formed between the outer edges 22 of the cooling fins 20 and the pair of side walls 50.

No sealing members as separate members are disposed between the pair of side walls 50 and the frame member 60. In addition, no sealing members as separate members are disposed between the pair of side walls 50 and the cooling fins 20. That is, in the inverter device 100 according to the first embodiment, the dustproof and waterproof structure is formed in a state where no sealing members are disposed between the frame member 60 and the pair of side walls 50.

(Structure for Cooling Inverter Device)

A structure for cooling the inverter device 100 according to the first embodiment is now described with reference to FIG. 2.

In the inverter device 100, the power conversion circuit 10 as a heat generator is disposed in contact with the cooling fins 20. Thus, the heat from the power conversion circuit 10 transferred to the cooling fins 20.

A plurality of fans 21 are provided on the arrow Y2 direction side of the top plate 31. The pair of side walls 50 include a plurality of vent holes 56c and 56d along the direction X. The vent holes 56c are portions of the pair of side walls 50 corresponding to the rear housing 30b, and are provided below (arrow Z2 direction side) the cooling fins 20. The vent holes 56d are portions of the pair of side walls 50 corresponding to the front housing 30a, and are provided below (arrow Z2 direction side) the power conversion circuit 10. Furthermore, although not shown in the drawings, the bottom plate 32 includes the air intake holes.

The front wall 33 includes a plurality of vent holes 33c. The fans 21 guide the air (outside air) taken in through the vent holes 56c and the air intake holes provided in the bottom plate 32 inside the housing 30, and discharge the air inside the housing 30. The cooling fins 20, the power conversion circuit 10, and the capacitors 11 contact the guided air such that the heat thereof is released. Thus, the power conversion circuit 10 and the capacitors 11 are cooled.

[Method for Manufacturing Inverter Device According to First Embodiment]

A method for manufacturing (assembling) the inverter device 100 according to the first embodiment is now described with reference to FIGS. 1 to 11.

According to the first embodiment, aluminum or an aluminum alloy is molded by extrusion in the direction Z with an extrusion molding die (not shown) to form the pair of side walls 50 that constitute the housing 30 shown in FIGS. 11(a) and 11(b). Then, additional processing is performed on the pair of side walls 50 to form each hole (the fastening holes 56a, fin fixing holes 56b, and vent holes 56c and 56d).

Then, sheet metal (galvanized steel plate, for example) or the like is punched and bent to form the rear wall 34, the frame member 60 (see FIG. 4), and the front wall 33 that constitute the housing 30. In addition, the top plate 31 and the bottom plate 32 are formed by die casting (casting).

Then, as shown in FIGS. 7(a) and 7(b), the pair of side walls 50 are mounted on the rear wall 34. Specifically, the outer edges 34b of the rear wall 34 are fitted into the engagement grooves 51 of the pair of side walls 50. More specifically, in a state where the pair of side walls 50 are inclined with respect to the direction (direction Y) substantially perpendicular to the rear wall 34 (see FIG. 7(a)), the pair of side walls sandwich the rear wall 34 from both sides in the direction X. In this state, the rotation of the pair of side walls 50 inwardly of the direction (direction Y) substantially perpendicular to the rear wall 34 is restricted (see FIG. 7(b)).

Then, as shown in FIGS. 11(a) and 11(b), in a state where the pair of side walls 50 are inclined with respect to the direction (direction Y) substantially perpendicular to the rear wall 34 (see FIG. 5), the frame member 60 is slid in the arrow Z1 direction inside the pair of side walls 50, and is disposed at a predetermined position. At this time, the side surfaces 55a of the inward protrusions 55 serve as guides for movement of the frame member 60.

As shown in FIG. 3, in a state where the pair of side walls 50 are inclined with respect to the direction (direction Y) substantially perpendicular to the rear wall 34, the cooling fins 20 are slid in the arrow Z1 direction and are disposed at a predetermined position. Then, the cooling fins 20 and the frame member 60 are fastened and fixed by the fastening members 40.

Then, as shown in FIG. 6, the pair of side walls 50 are disposed in the direction substantially perpendicular to the rear wall 34. In this state, the protrusions 71 of the frame member 60 and the inclined surfaces 52 of the pair of side walls 50 come into contact with each other over the direction Z, and the surfaces 72 of the frame member 60 and the side surfaces 55a of the inward protrusions 55 come into contact (surface contact) with each other over the direction Z. Thus, the dustproof and waterproof structure is formed between the outer edges 70 of the frame member 60 and the pair of side walls 50. Then, as shown in FIG. 10, the labyrinth structure is formed between the outer edges 22 of the cooling fins 20 and both the inward protrusions 55 (side surfaces 55b and 55c) and the inner side surfaces 53b of the pair of side walls 50.

Then, as shown in FIGS. 1 and 2, in a state where the pair of side walls 50 are disposed in the direction substantially perpendicular to the rear wall 34, the top plate 31 and the fans 21 are disposed on the arrow Z1 direction side of the pair of side walls 50, and the top plate 31 and the pair of side walls 50 are fastened and fixed by the fastening members 40. Thus, the protrusions 71 of the frame member 60 and the inclined surfaces 52 of the pair of side walls 50 press (strongly press) each other, and in a state where the protrusions 71 and the inclined surfaces 52 press (strongly press) each other, the frame member 60 and the pair of side walls 50 are fixed to each other. Furthermore, the cooling fins 20 and the pair of side walls 50 are fastened and fixed by the fastening members 40.

Then, the bottom plate 32 and the pair of side walls 50 are fastened and fixed to each other. In addition, the power conversion circuit 10 and the capacitors 11 are fixed to the frame member 60 by fastening members (not shown).

Then, the front wall 33 is fastened and fixed to the top plate 31 and the bottom plate 32 by the fastening members 40. Thereafter, a process for manufacturing (assembling) the inverter device 100 according to the first embodiment is terminated.

(Effects of First Embodiment)

According to the first embodiment, the following effects can be obtained.

According to the first embodiment, as hereinabove described, in a state where the side walls 50 are disposed substantially perpendicular to the rear wall 34, the outer edges 70 of the frame member 60 are pressed by the side walls 50 such that the frame member 60 is fixed to the side walls 50. Thus, the frame member 60 can be fixed to the side walls 50 without using fastening members such as screws. Consequently, it is possible to significantly reduce or prevent an increase in the number of components in the inverter device 100 due to fixing of the frame member 60 and the side walls 50 to each other, and it is possible to significantly reduce or prevent an increase in the number of steps for assembling the inverter device 100 as compared with the case where the inverter device 100 is assembled using a plurality of fastening members such as screws.

According to the first embodiment, as hereinabove described, the inner portions of the side walls 50 include the inclined surfaces 52 that engage with the outer edges 70. Thus, the inner portions of the side walls 50 and the outer edges 70 can engage with each other, and hence the frame member 60 can be more firmly fixed to the side walls 50.

According to the first embodiment, as hereinabove described, the inner portions of the side walls 50 include the engagement grooves 51 that engage with the outer edges 34b of the rear wall 34 such that the side walls 50 can be inclined with respect to the direction substantially perpendicular to the rear wall 34. Thus, the side walls 50 and the rear wall 34 can be engaged with each other by the engagement grooves 51 without using fastening members such as screws, and hence the number of components in the inverter device 100 can be reduced, and the number of steps for assembling the inverter device 100 can be reduced. Furthermore, in a state where the side walls 50 and the rear wall 34 engage with each other, the side walls 50 can be inclined with respect to the direction substantially perpendicular to the rear wall 34, and hence the side walls 50 are inclined with respect to the rear wall 34 in a state where the side walls 50 and the rear wall 34 engage with each other such that the frame member 60 can be easily disposed between the pair of inclined side walls 50.

According to the first embodiment, as hereinabove described, the outer edges 70 of the frame member 60 include the bent portions 71a that protrude in the direction substantially perpendicular to the frame member body 60a, and the bent portions 71a engage with the inclined surfaces 52. Thus, the outer edges 70 of the frame member 60 and the inclined surfaces 52 can be easily engaged with each other by the bent portions 71a that protrude in the direction substantially perpendicular to the frame member body 60a.

According to the first embodiment, as hereinabove described, the outer edges 34b of the rear wall 34 include the protrusions 34c that protrude in the direction substantially perpendicular to the rear wall body of the rear wall 34. The protrusions 34c engage with the engagement grooves 51. Thus, the rear wall 34 and the engagement grooves 51 can be easily engaged with each other by the protrusions 34c that protrude in the direction substantially perpendicular to the rear wall body.

According to the first embodiment, as hereinabove described, the housing 30 includes the top plate 31 fixed to the pair of side walls 50 in a state where the top plate 31 is disposed substantially perpendicular to each of the pair of side walls 50 and the rear wall 34. Thus, a state where the pair of side walls 50 are disposed substantially perpendicular to the rear wall 34 can be maintained due to the top plate 31, and hence the top plate 31 is disposed such that the pair of side walls 50 and the frame member 60 can be fixed to each other without separately providing a step for fixing the pair of side walls 50 and the frame member 60 to each other. As a result, the number of steps for assembling the inverter device 100 can be reduced.

According to the first embodiment, as hereinabove described, the side walls 50 (recess) include the inclined surfaces 52 that press the bent portions 71a in a state where the side walls 50 are disposed in the direction substantially perpendicular to the rear wall 34. Thus, even when a dimensional error of the frame member body 60a or the bent portions 71a or flexure deformation of the bent portions 71a occurs, the ends 71c of the bent portions 71a in the protruding direction are reliably pressed by the inclined surfaces 52 such that the frame member 60 and the side walls 50 can be fixed to each other.

According to the first embodiment, as hereinabove described, the side walls 50 include the inward protrusions 55 that protrude inwardly, and the outer edges 70 include the surfaces 72 that come into contact with the side surfaces 55a of the inward protrusions 55. Thus, in a state where the outer edges 70 are pressed by the side walls 50, the side surfaces 55a of the inward protrusions 55 and the surfaces 72 come into contact with each other, and hence the frame member 60 and the pair of side walls 50 can be more firmly fixed to each other.

According to the first embodiment, as hereinabove described, in the inverter device 100, the frame member 60 is slidable along the inner side surfaces 53a of the side walls 50 in a state where the pair of side walls 50 are inclined with respect to the direction substantially perpendicular to the rear wall 34. Thus, when the inverter device 100 is assembled, the frame member 60 is slid along the inner side surfaces 53a of the pair of side walls 50 such that the frame member 60 can be easily disposed inside the pair of side walls 50.

According to the first embodiment, as hereinabove described, the pair of side walls 50 are molded by extrusion in the direction along the outer edges 70. Thus, a plurality of types of side walls 50 having different dimensions in the arrow Z direction along the outer edges 70 can be molded with the same extrusion die, and hence it is possible to significantly reduce or prevent complexity of a manufacturing apparatus for the inverter device 100.

According to the first embodiment, as hereinabove described, in a state where the protrusions 71 and the surfaces 72 provided along the outer edges 70 of the frame member 60 and that contact the pair of side walls 50 are pressed by the pair of side walls 50, the contact structure is formed between the inner portions of the pair of side walls 50 and the outer edges 70. Thus, the contact structure can significantly reduce or prevent passing of liquid (water), dust, etc. in portions between the inner portions of the pair of side walls 50 and the outer edges 70, and hence it is not necessary to provide sealing members or the like for waterproofing and dustproofing separately from the frame member 60 and the side walls 50. As a result, it is possible to significantly reduce or prevent an increase in the number of components while ensuring the waterproofness and dustproofness.

According to the first embodiment, as hereinabove described, in the inverter device 100, the protrusions 71 and the surfaces 72 of the frame member 60 are pressed by the side walls 50 to form the dustproof and waterproof structure as the contact structure. Thus, the dustproofness and waterproofness can be easily ensured by the dustproof and waterproof structure between both the protrusions 71 and the surfaces 72 and the pair of side walls 50 without providing sealing members.

According to the first embodiment, as hereinabove described, the protrusions 71 are provided from the vicinities of the first ends 70a of the outer edges 70 to the vicinities of the second ends 70b thereof. Furthermore, the inner portions of the pair of side walls 50 include the inclined surfaces 52 provided along the outer edges 70 and that contact the protrusions 71. Thus, the dustproofness and waterproofness can be ensured without providing sealing members over a wide range from the vicinities of the first ends 70a of the outer edges 70 to the vicinities of the second ends 70b thereof.

According to the first embodiment, as hereinabove described, the outer edges 70 include the bent portions 71a that protrude in the direction substantially perpendicular to the frame member body 60a. The side walls 50 include the inclined surfaces 52 that come into contact with the bent portions 71a. Thus, even when a dimensional error of the frame member body 60a or the bent portions 71a or flexure deformation of the bent portions 71a occurs, the ends 71c of the protrusions 71 can be reliably pressed by the inclined surfaces 52, and hence the dustproofness and waterproofness can be more reliably ensured.

According to the first embodiment, as hereinabove described, the side walls 50 include the inward protrusions 55 that protrude inwardly. Furthermore, the outer edges 70 of the frame member 60 include the protrusions 71 that contact the inclined surfaces 52 and the surfaces 72 that contact the side surfaces 55a of the inward protrusions 55 in a state where the inclined surfaces 52 and the protrusions 71 contact each other. Thus, both the protrusions 71 and the surfaces 72 can significantly reduce or prevent passing of liquid (water), dust, etc. in the portions between the inner portions of the pair of side walls 50 and the outer edges 70, and hence the dustproofness and waterproofness can be further improved.

According to the first embodiment, as hereinabove described, in the inverter device 100, the side surfaces 55a of the inward protrusions 55 and the surfaces 72 come into surface contact with each other. Thus, the dustproofness and waterproofness can be still further improved as compared with the case where the side surfaces 55a of the inward protrusions 55 and the surfaces 72 come into line contact with each other.

According to the first embodiment, as hereinabove described, the labyrinth structure is formed by the pair of side walls 50 and the outer edges 22 of the cooling fins 20 on the side surface 55c sides of the inward protrusions 55. Thus, the dustproof and waterproof structure can also be formed between the pair of side walls 50 and the outer edges 22 of the cooling fins 20, and hence the dustproofness and waterproofness can be ensured not only between the frame member 60 and the pair of side walls 50 but also between the cooling fins 20 and the pair of side walls 50.

According to the first embodiment, as hereinabove described, in the inverter device 100, the outer edges 70 are not pressed by the pair of side walls 50 in a state where the pair of side walls 50 are inclined outwardly with respect to the direction substantially perpendicular to the rear wall 34, but the outer edges 70 are pressed by the pair of side walls 50 in a state where the pair of side walls 50 are disposed in the direction substantially perpendicular to the rear wall 34. Thus, the angle of the pair of side walls 50 with respect to the rear wall 34 is changed such that it is possible to easily switch between a state where the outer edges 70 are pressed by the pair of side walls 50 and a state where the outer edges 70 are not pressed by the pair of side walls 50. As a result, when the inverter device 100 is assembled, for example, the frame member 60 can be easily disposed at a corresponding position between the pair of side walls by inclining the pair of side walls 50 outwardly with respect to the direction substantially perpendicular to the rear wall 34. Furthermore, the outer edges 70 are pressed by the pair of side walls 50 by disposing the pair of side walls 50 in the direction substantially perpendicular to the rear wall 34 when the inverter device 100 is assembled, and hence the inverter device 100 can be easily assembled.

[Second Embodiment]

The configuration of an inverter device 300 according to a second embodiment is now described with reference to FIGS. 12 to 17. In this inverter device 300 according to the second embodiment, a pair of side walls 350 do not press a frame member 360 in a state where the pair of side walls 350 are inclined inwardly with respect to a direction substantially perpendicular to a rear wall 334, unlike the first embodiment in which the pair of side walls 50 do not press the frame member 60 in a state where the pair of side walls 50 are inclined outwardly with respect to the direction substantially perpendicular to the rear wall 34. In the figures, the same structures as those of the aforementioned first embodiment are denoted by the same reference numerals, and description thereof is omitted.

Figure 12:
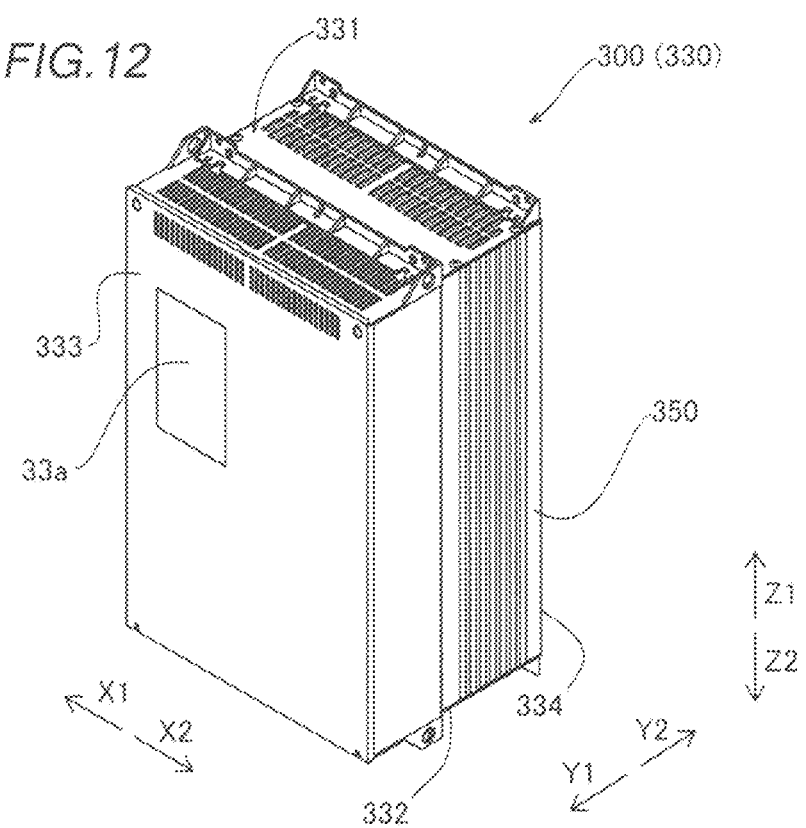
FIG. 12 is a perspective view of an inverter device according to a second embodiment of the present invention.
Figure 13:
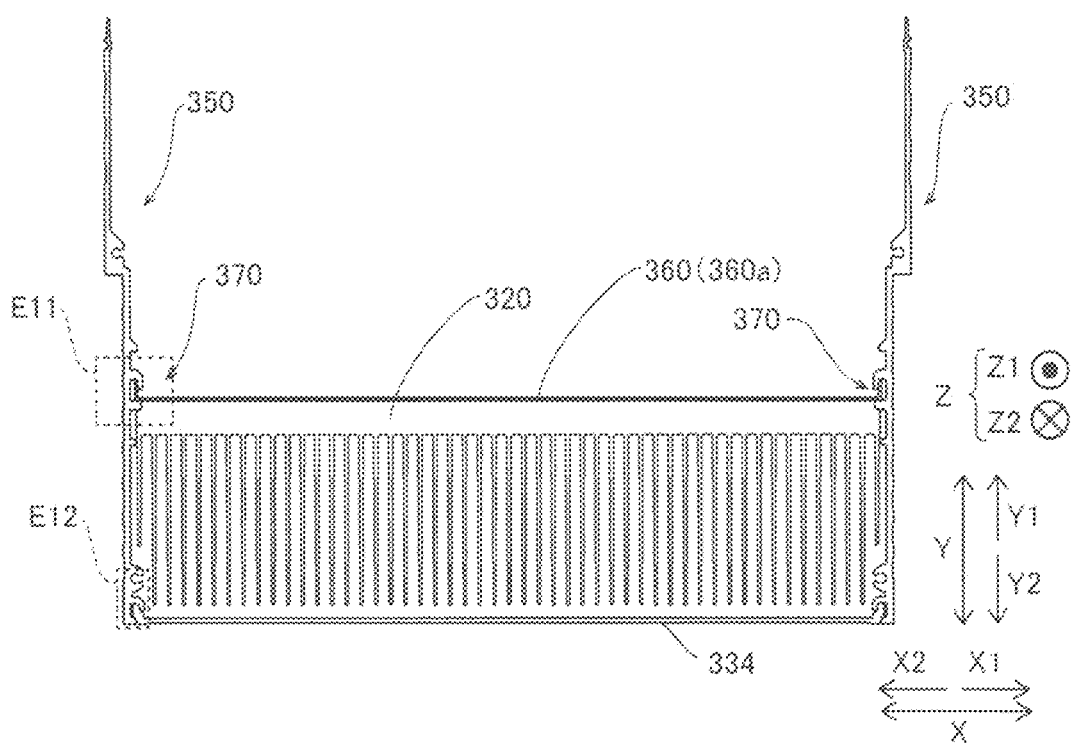
FIG. 13 is a sectional view of the inverter device according to the second embodiment of the present invention.

As shown in FIGS. 12 and 13, the inverter device 300 according to the second embodiment includes a housing 330 and the frame member 360. The housing 330 includes a top plate 331, a bottom plate 332, a front wall 333, the rear wall 334, and the pair of side walls 350. The frame member 360 is an example of a "partition" in the claims. The rear wall 334 is an example of a "connection wall" in the claims.

As shown in FIG. 14, the frame member 360 includes a frame member body 360a having a flat plate shape that extends in an XZ plane, and the outer edges 370 of the frame member body 360a include protrusions 371 including bent portions 371b formed by bending the frame member 360 at about 90 degrees in a direction (arrow Y1 direction) perpendicular to the frame member body 360a. The frame member body 360a is an example of a "partition body" in the claims.

The pair of side walls 350 include second engagement grooves 352 that do not engage with the protrusions 371 in a state where the pair of side walls 350 are inclined inwardly (in an arrow A11 direction) with respect to the direction (direction Y) substantially perpendicular to the rear wall 334, as shown in FIG. 14, but engage with the protrusions 371 in a state where the pair of side walls 350 are disposed in the direction (direction Y) substantially perpendicular to the rear wall 334, as shown in FIG. 15. The second engagement grooves 352 are examples of a "first side wall-side engagement portion" in the claims.

As shown in FIG. 15, according to the second embodiment, in a state where the pair of side walls 350 are disposed substantially perpendicular to the rear wall 334, the outer edges 370 of the frame member 360 are pressed outwardly by the pair of side walls 350 such that the frame member 360 is fixed to the pair of side walls 350.

Specifically, the second engagement grooves 352 include engagement protrusions 352a that press the vicinities of the distal ends 371a of the protrusions 371 and include inclined surfaces 352b inclined with respect to the protrusions 371. The engagement protrusions 352a protrude in a direction (arrow Y2 direction) opposite to the protruding direction (arrow Y1 direction) of the bent portions 371b of the frame member 360, and overlap the bent portions 371b as viewed in a direction X.

As shown in FIG. 15, a gap CL1 is provided between the inner side surface 353a of the second engagement groove 352 on the arrow X2 direction side and the bent portion 371b of the protrusion 371, and in a state where the pair of side walls 350 are inclined inwardly (in the arrow A11 direction in FIG. 14, for example) with respect to the direction Y, as shown in FIG. 14, the second engagement groove 352 and the bent portion 371b of the protrusion 371 do not engage with each other.

Therefore, also according to the second embodiment, similarly to the housing 30 according to the first embodiment, in the housing 330, the frame member 360 is slidable along the inner side surfaces 353a of the pair of side walls 350 in a state where the pair of side walls 350 are inclined in the arrow A11 direction with respect to the direction (direction Y) substantially perpendicular to the rear wall 334.

As shown in FIG. 15, in a state where the pair of side walls 350 are disposed in the direction (direction Y) substantially perpendicular to the rear wall 334, the inclined surfaces 352b press the distal ends 371a of the protrusions 371 such that a strong pressing structure is formed between the pair of side walls 350 and the frame member 360, and the pair of side walls 350 and the frame member 360 are fixed to each other. Furthermore, the frame member 360 is pressed by the pair of side walls 350 such that a dustproof and waterproof structure is formed between the pair of side walls 350 and the frame member 360.

The pair of side walls 350 includes inward protrusions 355 that face each other and protrude inwardly, respectively, and the outer edges 370 of the frame member 360 include surfaces 372 that come into contact with the side surfaces 355a of the inward protrusions 355 in a state where the vicinities of the distal ends 371a of the protrusions 371 are pressed by the pair of side walls 350. Thus, the dustproof and waterproof structure is formed between the pair of side walls 350 and the frame member 360. The inward protrusions 355 are examples of a "side wall-side protrusion" in the claims. The side surfaces 355a are examples of a "first surface" in the claims.

The outer edges 322 of cooling fins 320 include concave portions 322a into which the inward protrusions 355 are fitted and convex portions 322b adjacent to the side surfaces 355c of the inward protrusions 355 on the arrow Y2 direction side. A labyrinth structure is formed by the side surfaces 355b and 355c of the inward protrusions 35, the inner side surfaces 353b of the pair of side walls 350, and the concave portions 322a and the convex portions 322b of the cooling fins 320. Thus, the dustproof and waterproof structure is formed between the pair of side walls 350 and the cooling fins 320. The cooling fins 320 are examples of a "cooler" in the claims. The side surfaces 355c are examples of a "second surface" in the claims.

Figure 16A:
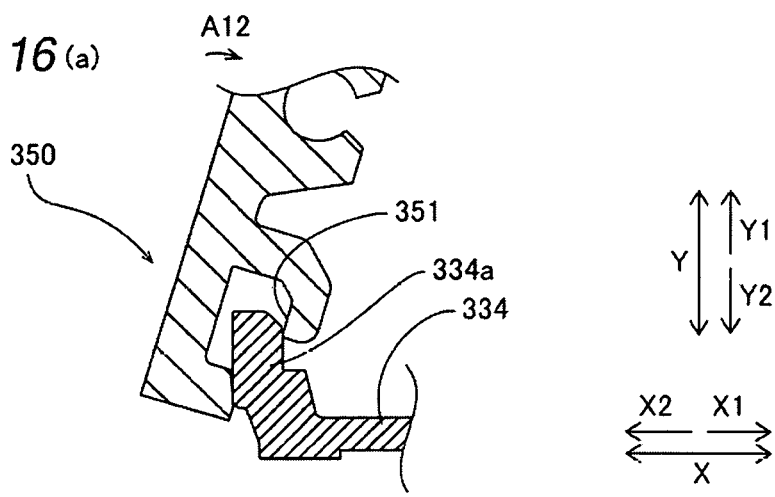
FIGS. 16(a), 16(b) and 16(c) are partial enlarged views, each showing a region indicated by a reference numeral E12 in FIG. 13, and illustrates engagement between the pair of side walls and a rear wall.
Figure 16B:
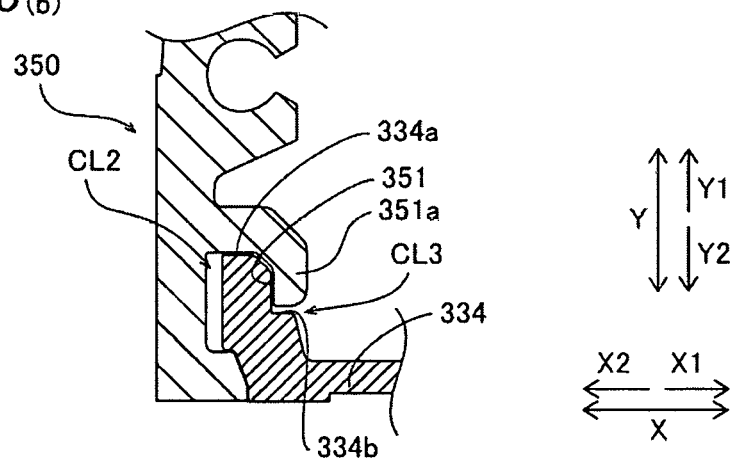
Figure 16C:
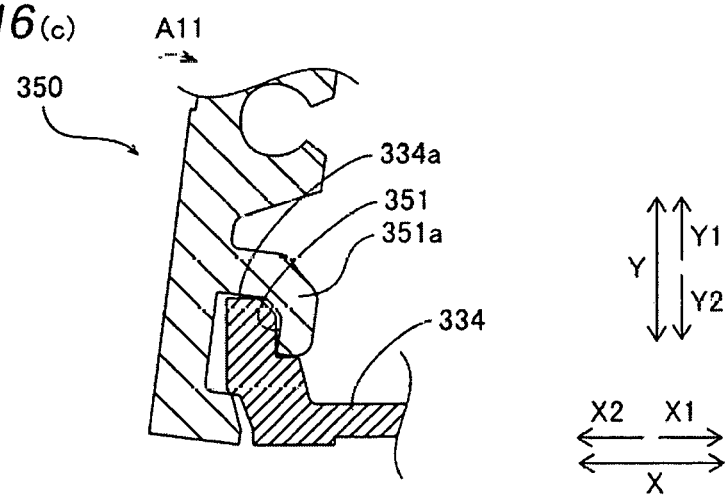

As shown in FIGS. 16(a), 16(b) and 16(c), the pair of side walls 350 include first engagement grooves 351 that engage with protrusions 334a of the rear wall 34 such that the pair of side walls 350 can be inclined with respect to the direction substantially perpendicular to the rear wall 334. The protrusions 334a are examples of an "outer edge of the connection wall" in the claims. The first engagement grooves 351 are examples of a "second side wall-side engagement portion" in the claims.

Specifically, the first engagement grooves 351 include openings on the inner sides of the pair of side walls 350, and are recessed in the arrow Y1 direction. The rear wall 334 includes the protrusions 334a that protrude in the arrow Y1 direction on its outer edges. In addition, the protrusions 334a include steps 334b.

In a state where the pair of side walls 350 are inclined in an arrow A12 direction as shown in FIG. 16(a), the protrusions 334a of the rear wall 334 are fitted into the first engagement grooves 351 of the pair of side walls 350.

In a state where the protrusions 334a of the rear wall 334 and the first engagement grooves 351 of the pair of side walls 350 engage with each other as shown in FIG. 16(b), the protrusions 334a and the protrusions 351a of the first engagement grooves 351 contact each other such that the outward rotation of the pair of side walls 350 is restricted. On the other hand, gaps CL2 are provided between the protrusions 334a and the side surfaces 351b of the first engagement grooves 351, and gaps CL3 are provided between the steps 334b and the protrusions 351a such that in the inverter device 300, the pair of side walls 350 can be inclined inwardly (in the arrow A11 direction) with respect to the direction Y in a state where the protrusions 334a of the rear wall 334 and the first engagement grooves 351 of the pair of side walls 350 engage with each other as shown in FIG. 16(c).

As shown in FIG. 11, in a state where the pair of side walls 350 are disposed substantially perpendicular to the rear wall 334, the top plate 331 is fixed to the pair of side walls 350 by fastening members 40 disposed in fastening holes 331a. Similarly to the first embodiment, the pair of side walls 350 are disposed substantially perpendicular to the rear wall 334 in a state where the top plate 331 is fixed to the pair of side walls 350, and the outer edges 370 are pressed by the pair of side walls 350. Thus, the top plate 331, the pair of side walls 350, and the frame member 360 are fixed to each other. The remaining configurations of the second embodiment are similar to those of the first embodiment.

[Method for Manufacturing Inverter Device According to Second Embodiment]

A method for manufacturing (assembling) the inverter device 300 according to the second embodiment is now described with reference to FIGS. 12 to 17. Description of the same contents as those of the method for manufacturing the inverter device 100 according to the first embodiment is omitted.

According to the second embodiment, as shown in FIGS. 16(a) and 16(b), the pair of side walls 350 are mounted on the rear wall 334. Specifically, in a state where the pair of side walls 350 are inclined in the arrow A12 direction, the protrusions 334a of the rear wall 334 are fitted into the first engagement grooves 351 of the pair of side walls 350.

Then, in a state where the pair of side walls 350 are inclined inwardly (in the arrow A11 direction) with respect to the direction (direction Y) substantially perpendicular to the rear wall 34 as shown in FIG. 14, the frame member 60 is slid in the arrow Z1 direction and is disposed at a predetermined position inside the pair of side walls 350. At this time, the side surfaces 355a of the inward protrusions 355 and the second engagement grooves 352 serve as guides for movement of the frame member 360.

Figure 17:
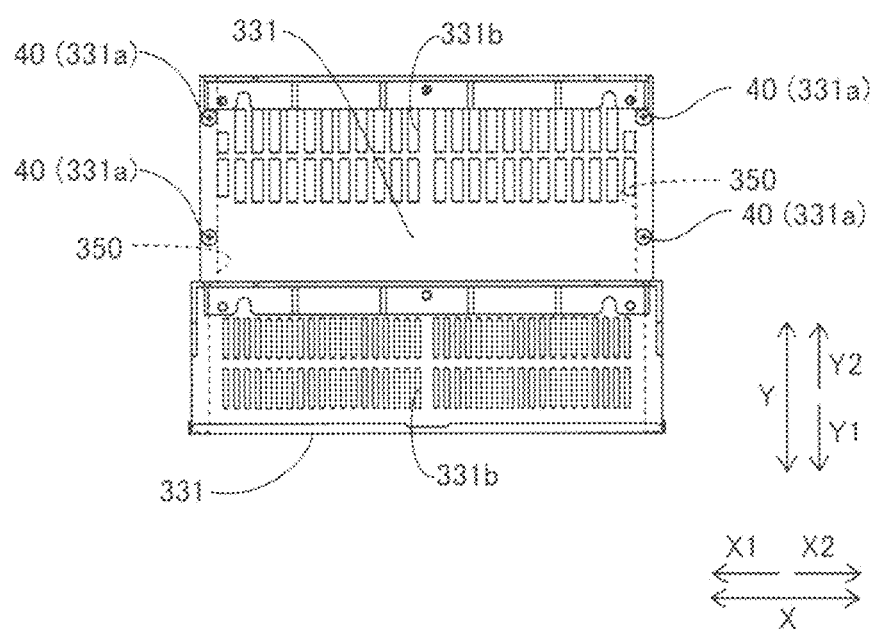
FIG. 17 is a plan view for illustrating a configuration for fixing a top plate and the pair of side walls to each other according to the second embodiment of the present invention.

Thereafter, as shown in FIG. 17, the top plate 331 and the pair of side walls 350 are fixed to each other in a state where the pair of side walls 350 are disposed in the direction substantially perpendicular to the rear wall 334. Thus, the protrusions 371 of the frame member 360 and the inclined surfaces 352b of the pair of side walls 350 come into contact with each other over a direction Z, and the surfaces 372 of the frame member 360 and the side surfaces 355a of the inward protrusions 355 come into contact (surface contact) with each other over the direction Z. As a result, the dustproof and waterproof structure is formed between the outer edges 370 of the frame member 360 and the pair of side walls 350. Furthermore, the labyrinth structure is formed between the outer edges 322 of the cooling fins 320 and both the inward protrusions 355 and the inner side surfaces 353b of the pair of side walls 350. In addition, the top plate 331 includes vent holes 331b, and outside air is guided to the cooling fins 320 etc. such that heat is released from the cooling fins 320. The remaining manufacturing steps of the second embodiment are similar to those of the first embodiment.

(Effects of Second Embodiment)

According to the second embodiment, the following effects can be obtained.

According to the second embodiment, as hereinabove described, the outer edges 370 of the frame member 360 include the protrusions 371 that protrude in the direction substantially perpendicular to the rear wall 334 and extend along the pair of side walls 350. Furthermore, the pair of side walls 350 include the second engagement grooves 352 that do not engage with the protrusions 371 in a state where the pair of side walls 350 are inclined inwardly with respect to the direction substantially perpendicular to the rear wall 334 but engage with the protrusions 371 in a state where the pair of side walls 350 are disposed in the direction substantially perpendicular to the rear wall 334. Thus, when the inverter device 300 is assembled, the frame member 360 can be easily disposed at a corresponding position between the pair of side walls 350 in a state where the protrusions 371 and the second engagement grooves 352 do not engage with each other by inclining the pair of side walls 350 inwardly with respect to the direction substantially perpendicular to the rear wall 334. Furthermore, when the inverter device 300 is assembled, the protrusions 371 and the second engagement grooves 352 can be engaged with each other by disposing the pair of side walls 350 in the direction substantially perpendicular to the rear wall 334. The remaining effects of the second embodiment are similar to those of the first embodiment.

[Modification]

The embodiments disclosed this time must be considered as illustrative in all points and not restrictive. The range of the present invention is shown not by the above description of the embodiments but by the scope of claims for patent, and all modifications within the meaning and range equivalent to the scope of claims for patent are further included.

For example, while the inverter device is fixed to the power board in each of the aforementioned first and second embodiments, the present invention is not restricted to this. That is, the inverter device may not be fixed to the power board but may be independently disposed.

While the pair of side walls and the frame member come into contact with each other over the direction Z in each of the aforementioned first and second embodiments, it is not necessary to bring the pair of side walls and the frame member come into contact with each other over the direction Z when the dustproof and waterproof structure is not required. For example, the pair of side walls and the frame member may alternatively come into contact with each other at a plurality of positions in the direction Z so far as the strength is sufficiently ensured such that a structure without screws can be achieved between the pair of side walls and the frame member.

While in the inverter device, the frame member is slidable with respect to the pair of side walls in each of the aforementioned first and second embodiments, the present invention is not restricted to this. For example, if no problem is caused by complicating assembly of the inverter device, the inverter device may alternatively be configured such that the frame member can be disposed from the front side (arrow Y1 direction side) in a state where the pair of side walls are inclined.

While the pair of side walls are fixed by fixing the top plate to the pair of side walls in a state where the same are disposed substantially perpendicular to the rear wall in each of the aforementioned first and second embodiments, the present invention is not restricted to this. That is, the pair of side walls may alternative be fixed by a fixing member other than the top plate in a state where the same are disposed substantially perpendicular to the rear wall. For example, the pair of side walls and a bottom plate of the rear wall may be directly fixed to each other by fastening members or the like in a state where the pair of side walls are disposed substantially perpendicular to the rear wall. When the pair of side walls are fixed by the top plate in a state where the same are disposed substantially perpendicular to the rear wall, a structure without screws can be formed between the pair of side walls and the bottom plate of the rear wall.

While the outer edges of the frame member include the protrusions, the protruding direction of which is forward (in the arrow Y1 direction), in each of the aforementioned first and second embodiments, the present invention is not restricted to this. That is, the outer edges of the frame member may alternatively include protrusions, the protruding direction of which is rearward (in the arrow Y2 direction). For example, the pair of side walls may be molded by die casting.

While the pair of side walls are molded by extrusion, the frame member is molded by bending, and the top plate and the bottom plate are molded by die casting in each of the aforementioned first and second embodiments, the present invention is not restricted to this. That is, the methods for molding the pair of side walls, the frame member, the top plate, and the bottom plate may alternatively be changed as appropriate according to the type of the inverter device or the like. The pair of side walls are preferably molded by extrusion since components can be shared between different inverter devices.

While the frame member is independently slid with respect to the pair of side walls in each of the aforementioned first and second embodiments, the present invention is not restricted to this. That is, the frame member may alternatively be slid with respect to the pair of side walls in a state where the cooling fins are fixed to the frame member.

While the structure without screws is formed between the frame member and the side walls in each of the aforementioned first and second embodiments, the present invention is not restricted to this. That is, the frame member and the side walls may alternatively be fixed to each other by screws (fastening members). From the viewpoint of significantly reducing or preventing an increase in the number of components, the structure without screws is preferably formed between the frame member and the side walls.

While in the inverter device, the surfaces of the outer edges of the frame member and the inward protrusions come into surface contact with each other in each of the aforementioned first and second embodiments, the present invention is not restricted to this. For example, so far as a contact structure (dustproof and waterproof structure) is formed between the outer edges of the frame member and the inward protrusions, the surfaces of the outer edges of the frame member and the inward protrusions may alternatively come into line contact with each other in the inverter device.

What is claimed is:

1. An inverter device comprising:
a heat generator including a power conversion element;
a cooler that cools the heat generator;
a housing that houses the heat generator and the cooler and includes a pair of side walls that face each other, and a connection wall that connects the pair of side walls to each other; and
a partition provided separately from the housing wherein the heat generator is disposed on a first side and the cooler is disposed on a second side, wherein
in a state where the pair of side walls are disposed substantially perpendicular to the connection wall, an outer edge of the partition is pressed by the pair of side walls,
in the state where the pair of side walls are disposed substantially perpendicular to the connection wall, the outer edge of the partition is pressed by the pair of side walls such that the partition is fixed to inner sides of the pair of side walls,
inner portions of the pair of side walls each include a first side wall-side engagement portion that engages with the outer edge of the partition,
the outer edge of the partition includes a bent portion that protrudes in a direction substantially perpendicular to a partition body of the partition, and
the bent portion engages with the first side wall-side engagement portion.

2. The inverter device according to claim 1, wherein
inner portions of the pair of side walls each include a second side wall-side engagement portion that engages with an outer edge of the connection wall such that the pair of side walls are inclined with respect to a direction substantially perpendicular to the connection wall.

3. The inverter device according to claim 2, wherein
the outer edge of the connection wall includes a connection wall-side protrusion that protrudes in a direction substantially perpendicular to a connection wall body of the connection wall, and
the connection wall-side protrusion engages with the second side wall-side engagement portion.

4. The inverter device according to claim 1, wherein
the housing includes a top plate fixed to the pair of side walls in a state where the top plate is disposed substantially perpendicular to each of the pair of side walls and the connection wall.

5. The inverter device according to claim 1, wherein
the first side wall-side engagement portion includes an inclined surface that presses the bent portion in the state where the pair of side walls are disposed substantially perpendicular to the connection wall.

6. The inverter device according to claim 1, wherein
the pair of side walls each include a side wall-side protrusion that protrudes inwardly, and
the outer edge of the partition includes a partition-side contact portion that comes into contact with a first surface of the side wall-side protrusion.

7. The inverter device according to claim 1, wherein
the partition is slidable along inner side surfaces of the pair of side walls in a state where the pair of side walls are inclined with respect to a direction substantially perpendicular to the connection wall.

8. The inverter device according to claim 1, wherein
the pair of side walls are molded by extrusion in a direction along the outer edge of the partition.

9. The inverter device according to claim 1, wherein the housing further includes another connection wall that is formed separately from the pair of side walls and the connection wall and that connects the pair of side walls at one side opposite to the connection wall relative to the partition, and
the partition is arranged between the connection wall and the another connection wall, and the heat generator is disposed between the another connection wall and the partition and the cooler is disposed between the connection wall and the partition.

10. An inverter device comprising:
a heat generator including a power conversion element;
a cooler that cools the heat generator;
a housing that houses the heat generator and the cooler, and includes a pair of side walls that face each other, and a connection wall that connects the pair of side walls to each other; and
a partition provided separately from the housing wherein the heat generator is disposed on a first side and the cooler is disposed on a second side, wherein
in a state where the pair of side walls are disposed substantially perpendicular to the connection wall, an outer edge of the partition is pressed by the pair of side walls,
in a state where a contact portion of the partition that is provided along the outer edge of the partition and that contacts the pair of side walls is pressed by the pair of side walls, a contact structure is formed between inner portions of the pair of side walls and the outer edge of the partition,
the contact portion of the partition is provided from a vicinity of a first end of the outer edge of the partition to a vicinity of a second end thereof,
the inner portions of the pair of side walls each include a side wall-side contact portion provided along the outer edge of the partition and that contacts the contact portion of the partition,
the outer edge of the partition includes a bent portion that protrudes in a direction substantially perpendicular to a partition body of the partition, and
the side wall-side contact portion includes an inclined surface that comes into contact with the bent portion.

11. The inverter device according to claim 10, wherein
the contact portion of the partition is pressed by the pair of side walls to form a dustproof and waterproof structure as the contact structure.

12. The inverter device according to claim 10, wherein
the pair of side walls each include a side wall-side protrusion that protrudes inwardly, and
the contact portion of the partition includes a first partition-side contact portion that contacts the side wall-side contact portion and a second partition-side contact portion that contacts a first surface of the side wall-side protrusion in a state where the side wall-side contact portion and the first partition-side contact portion contact each other.

13. The inverter device according to claim 12, wherein the first surface of the side wall-side protrusion and the second partition-side contact portion come into surface contact with each other.

14. The inverter device according to claim 12, wherein a labyrinth structure is formed by the pair of side walls and an outer edge of the cooler on a second surface side of the side wall-side protrusion.

15. The inverter device according to claim 10, wherein the partition is slidable along inner side surfaces of the pair of side walls in a state where the pair of side walls are inclined with respect to a direction substantially perpendicular to the connection wall.

16. An inverter device comprising:

a heat generator including a power conversion element;

a cooler that cools the heat generator;

a housing that houses the heat generator and the cooler, and includes a pair of side walls that face each other, and a connection wall that connects the pair of side walls to each other, and a partition provided separately from the housing wherein the heat generator is disposed on a first side and the cooler is disposed on a second side, wherein in a state where the pair of side walls are disposed substantially perpendicular to the connection wall, an outer edge of the partition is pressed by the pair of side walls, in a state where a contact portion of the partition that is provided along the outer edge of the partition and that contacts the pair of side walls is pressed by the pair of side walls, a contact structure is formed between inner portions of the pair of side walls and the outer edge of the partition, and the outer edge of the partition is not pressed by the pair of side walls in a state where the pair of side walls are inclined with respect to a direction substantially perpendicular to the connection wall, but the outer edge of the partition is pressed by the pair of side walls in the state where the pair of side walls are disposed substantially perpendicular to the connection wall.

* * * * *